(12) United States Patent
Jurewicz et al.

(10) Patent No.: US 10,598,357 B2
(45) Date of Patent: *Mar. 24, 2020

(54) DISPLAY DEVICES

(71) Applicant: The Coca-Cola Company, Atlanta, GA (US)

(72) Inventors: William Jefferson Jurewicz, Minneapolis, MN (US); James Allen Squires, Big Lake, MN (US); Barrett David Haroldson, Golden Valley, MN (US); Lawrence Alexander Duarte, Centennial, CO (US); Jeremiah Matthew Hueske, Denver, CO (US); Lo Chi Kwong, Hong Kong (CN); Shawn Roske, Minneapolis, MN (US); Julio Obelleiro, Brooklyn, NY (US); Mervin Perkins, Arvada, CO (US); Ryan West, Newnan, GA (US); Peter Revelas, Atlanta, GA (US); Jonathan Kirschner, Powder Springs, GA (US); Lisa R. Marchbanks, Atlanta, GA (US); Marjorie Presten, Cumming, GA (US); Kathrine Marie Brown, Maple Grove, MN (US); Jeremy D. Billig, Larchmont, NY (US); Gregory Oren Bryant, San Luis Obispo, CA (US)

(73) Assignee: The Coca-Cola Company, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/271,395

(22) Filed: Feb. 8, 2019

(65) Prior Publication Data
US 2019/0257506 A1   Aug. 22, 2019

Related U.S. Application Data

(63) Continuation of application No. 15/854,513, filed on Dec. 26, 2017, now Pat. No. 10,208,934, which is a
(Continued)

(51) Int. Cl.
*F21V 21/22* (2006.01)
*G09F 9/00* (2006.01)
(Continued)

(52) U.S. Cl.
CPC .......... *F21V 21/22* (2013.01); *G06F 3/04845* (2013.01); *G06F 3/1446* (2013.01);
(Continued)

(58) Field of Classification Search
CPC . G06F 3/04845; G06F 3/1446; G06T 3/0093; G06T 11/60; G06T 19/00;
(Continued)

(56) References Cited

U.S. PATENT DOCUMENTS

| | | |
|---|---|---|
| 4,654,989 A | 4/1987 | Fleming |
| 4,757,626 A | 7/1988 | Weinreich |

(Continued)

FOREIGN PATENT DOCUMENTS

| | | |
|---|---|---|
| CN | 101546503 A | 9/2009 |
| DE | 10 2009 019 400 A1 | 11/2010 |

(Continued)

OTHER PUBLICATIONS

International Search Report and Written Opinion for PCT/US2017/053290 dated Jan. 4, 2018.
(Continued)

*Primary Examiner* — Muhammad N Edun
(74) *Attorney, Agent, or Firm* — Merchant & Gould P.C.

(57) ABSTRACT

A display device includes a base structure, a plurality of modules coupled to the base structure, where each of the
(Continued)

modules include a plurality of actuator assemblies. Each of the actuator assemblies is individually controllable to move the actuator assemblies between a retracted state and a plurality of extended states. A controller is coupled to each of the modules and is programmed to control the actuator assemblies to move the actuator assemblies between the retracted state and the plurality of extended states.

20 Claims, 27 Drawing Sheets

Related U.S. Application Data continuation of application No. 15/469,863, filed on Mar. 27, 2017, now Pat. No. 9,885,466, which is a continuation of application No. 14/996,049, filed on Jan. 14, 2016, now Pat. No. 9,640,118, which is a continuation of application No. 14/213,358, filed on Mar. 14, 2014, now Pat. No. 9,257,061.

(60) Provisional application No. 61/800,611, filed on Mar. 15, 2013.

(51) Int. Cl.
| | | |
|---|---|---|
| *G09F 13/00* | (2006.01) | |
| *G09G 5/02* | (2006.01) | |
| *G06T 11/60* | (2006.01) | |
| *G06F 3/0484* | (2013.01) | |
| *G06T 19/00* | (2011.01) | |
| *G09G 3/36* | (2006.01) | |
| *G06T 3/00* | (2006.01) | |
| *G06F 3/14* | (2006.01) | |
| *G09F 9/302* | (2006.01) | |
| *G09F 9/33* | (2006.01) | |
| *G09F 9/37* | (2006.01) | |
| *G09G 5/10* | (2006.01) | |
| *H05B 33/08* | (2020.01) | |
| *H05K 7/00* | (2006.01) | |
| *G09G 3/34* | (2006.01) | |
| *G09F 13/30* | (2006.01) | |
| *G09F 13/34* | (2006.01) | |
| *G09F 13/04* | (2006.01) | |
| *G09F 13/18* | (2006.01) | |
| *G09F 13/22* | (2006.01) | |

(52) U.S. Cl.
CPC ............ *G06T 3/0093* (2013.01); *G06T 11/60* (2013.01); *G06T 19/00* (2013.01); *G09F 9/00* (2013.01); *G09F 9/3026* (2013.01); *G09F 9/33* (2013.01); *G09F 9/372* (2013.01); *G09F 13/00* (2013.01); *G09F 13/005* (2013.01); *G09F 13/30* (2013.01); *G09F 13/34* (2013.01); *G09G 3/3433* (2013.01); *G09G 3/3648* (2013.01); *G09G 5/02* (2013.01); *G09G 5/10* (2013.01); *H05B 33/0842* (2013.01); *H05K 7/00* (2013.01); *G09F 2013/0454* (2013.01); *G09F 2013/189* (2013.01); *G09F 2013/222* (2013.01); *G09G 2300/026* (2013.01); *G09G 2300/0426* (2013.01); *G09G 2320/0613* (2013.01); *G09G 2360/144* (2013.01); *G09G 2380/06* (2013.01)

(58) Field of Classification Search
CPC .................. G09G 5/02; G09G 3/3433; G09G 2320/0613; G09G 3/3648; G09G 5/10; G09G 2300/026; G09G 2360/144; G09G 2380/06; G09G 2300/0426; H05B 33/0842; F21V 21/22; G09F 13/00; G09F 13/30; G09F 13/34; G09F 13/005; G09F 9/372; G09F 9/33; G09F 9/3026; G09F 2013/189; G09F 2013/0454; G09F 2013/222; G09F 9/00; H05K 7/00
See application file for complete search history.

(56) References Cited

U.S. PATENT DOCUMENTS

| | | |
|---|---|---|
| 5,077,608 A | 12/1991 | Dubner |
| 5,086,287 A | 2/1992 | Nützel |
| 5,525,000 A | 6/1996 | Belobraydich et al. |
| 5,717,423 A | 2/1998 | Parker |
| 5,793,918 A | 8/1998 | Hogan |
| 5,907,312 A | 5/1999 | Sato et al. |
| 6,189,246 B1 | 2/2001 | Gorthala |
| 6,433,761 B1 | 8/2002 | Remitz |
| 6,462,840 B1 | 10/2002 | Kravtsov |
| 6,546,655 B1 | 4/2003 | Hillstrom |
| 6,606,809 B2 | 8/2003 | Hillstrom et al. |
| 7,055,271 B2 | 6/2006 | Lutz et al. |
| 7,277,080 B2 | 10/2007 | Goulthorpe |
| 7,352,339 B2 | 4/2008 | Morgan et al. |
| 7,356,357 B2 | 4/2008 | DeCost et al. |
| 7,436,388 B2 | 10/2008 | Hillis et al. |
| 7,439,950 B2 | 10/2008 | Carlberg |
| 7,525,510 B2 | 4/2009 | Beland et al. |
| 7,551,771 B2 | 6/2009 | England, III |
| 7,552,553 B2 | 6/2009 | Kelly |
| 7,605,772 B2 | 10/2009 | Syrstad |
| 7,620,026 B2 | 11/2009 | Anschutz et al. |
| 7,653,569 B1 | 1/2010 | Zbib |
| 7,852,333 B2 | 12/2010 | Nishikawa et al. |
| 7,866,075 B2 | 1/2011 | Meeker et al. |
| 7,905,413 B2 | 3/2011 | Knowles et al. |
| 7,928,968 B2 | 4/2011 | Shon et al. |
| 7,948,450 B2 | 5/2011 | Kay et al. |
| 8,040,361 B2 | 10/2011 | Bachelder et al. |
| 8,081,158 B2 | 12/2011 | Harris |
| 8,152,062 B2 | 4/2012 | Perrier et al. |
| 8,232,976 B2 | 7/2012 | Yun et al. |
| 8,254,338 B2 | 8/2012 | Anschutz et al. |
| 8,289,274 B2 | 10/2012 | Sliwa et al. |
| 8,413,073 B2 | 4/2013 | Lee |
| 8,552,883 B1 | 10/2013 | Su |
| 8,576,212 B2 | 11/2013 | Lee et al. |
| 8,588,517 B2 | 11/2013 | Lee et al. |
| 8,606,043 B2 | 12/2013 | Kwon et al. |
| 9,257,061 B2 | 2/2016 | Jurewicz et al. |
| 9,269,283 B2 | 2/2016 | Jurewicz et al. |
| 9,640,118 B2 | 5/2017 | Jurewicz et al. |
| 9,885,466 B2 | 2/2018 | Jurewicz et al. |
| 10,208,934 B2 | 2/2019 | Jurewicz et al. |
| 2003/0080923 A1 | 5/2003 | Suyama et al. |
| 2004/0077285 A1 | 4/2004 | Bonilla et al. |
| 2004/0165006 A1 | 8/2004 | Kirby et al. |
| 2005/0017977 A1 | 1/2005 | Simpson et al. |
| 2005/0150147 A1 | 7/2005 | Berryman |
| 2005/0264430 A1 | 12/2005 | Zhang et al. |
| 2006/0055641 A1 | 3/2006 | Robertus et al. |
| 2006/0107567 A1 | 5/2006 | Liao |
| 2006/0285832 A1 | 12/2006 | Huang |
| 2007/0171674 A1 | 7/2007 | Deutsch |
| 2007/0244417 A1 | 10/2007 | Escriba Nogues |
| 2008/0010041 A1 | 1/2008 | McDaniel |
| 2008/0115187 A1 | 5/2008 | Decost et al. |
| 2008/0201208 A1 | 8/2008 | Tie et al. |
| 2008/0238889 A1 | 10/2008 | Thorne |
| 2008/0246757 A1 | 10/2008 | Ito |
| 2008/0266204 A1 | 10/2008 | Bartels et al. |
| 2009/0084010 A1 | 4/2009 | Dykstra |
| 2009/0177528 A1 | 7/2009 | Wu et al. |
| 2009/0184892 A1 | 7/2009 | Eberle et al. |
| 2010/0182340 A1 | 7/2010 | Bachelder et al. |
| 2010/0219973 A1 | 9/2010 | Griffin et al. |
| 2011/0128283 A1 | 6/2011 | Lee et al. |

(56) References Cited

U.S. PATENT DOCUMENTS

| | | |
|---|---|---|
| 2011/0175992 A1 | 7/2011 | Lee et al. |
| 2011/0193277 A1 | 8/2011 | Christenson |
| 2011/0225860 A1 | 9/2011 | Troiano et al. |
| 2011/0228058 A1 | 9/2011 | Hatasawa |
| 2011/0231231 A1 | 9/2011 | Cruz |
| 2011/0235332 A1 | 9/2011 | Cheung |
| 2012/0092337 A1 | 4/2012 | Tsao |
| 2012/0139919 A1 | 6/2012 | Shintani |
| 2012/0154438 A1 | 6/2012 | Cohen |
| 2012/0159820 A1 | 6/2012 | Van Saanen |
| 2012/0188235 A1 | 7/2012 | Wu et al. |
| 2012/0195463 A1 | 8/2012 | Shinkai |
| 2012/0224311 A1 | 9/2012 | Sutherland et al. |
| 2012/0242958 A1 | 9/2012 | Zuloff |
| 2013/0009951 A1 | 1/2013 | Kwon et al. |
| 2013/0041730 A1 | 2/2013 | LoBianco |
| 2013/0063561 A1 | 3/2013 | Stephan |
| 2013/0117121 A1 | 5/2013 | Raman et al. |
| 2013/0194059 A1 | 8/2013 | Parr |
| 2013/0265213 A1 | 10/2013 | Chen |
| 2013/0312300 A1 | 11/2013 | Lee |
| 2013/0321394 A1 | 12/2013 | Fisher et al. |
| 2014/0104389 A1 | 4/2014 | Dharmatilleke |
| 2014/0114708 A1 | 4/2014 | Campbell |
| 2014/0259824 A1 | 9/2014 | Jurewicz et al. |
| 2014/0267457 A1 | 9/2014 | Jurewicz et al. |

FOREIGN PATENT DOCUMENTS

| | | |
|---|---|---|
| GB | 2 363 506 A | 12/2001 |
| GB | 2 393 560 A | 3/2004 |
| GB | 2 428 433 A | 1/2007 |
| GB | 2 435 540 A | 8/2007 |
| JP | 4-14086 | 1/1992 |
| JP | 10-268796 A | 10/1998 |
| JP | 3127447 B2 | 1/2001 |
| JP | 2001-333438 A | 11/2001 |
| JP | 2007-225638 A | 9/2007 |
| WO | 2005/025377 A1 | 3/2005 |

OTHER PUBLICATIONS

International Search Report and Written Opinion for PCT/US2014/029573 dated Sep. 18, 2014.

DISPLAY DEVICES

CROSS-REFERENCE TO RELATED APPLICATION

This application claims the benefit of provisional application Ser. No. 61/800,611, filed on Mar. 15, 2013, which is incorporated herein by reference in its entirety.

BACKGROUND

Billboards and other large displays are an important component of most advertising portfolios. As with other real estate, location is key. Most displays are configured to catch the eyes of viewers, which can enhance the brands shown on the displays. In crowded display areas, it is important to make a display distinctive to optimize the impact of the display.

SUMMARY

In accordance with certain aspects of the present disclosure, a display device includes a base structure, a plurality of modules coupled to the base structure, where each of the modules include a plurality of actuator assemblies. Each of the actuator assemblies is individually controllable to move the actuator assemblies between a retracted state and a plurality of extended states. A controller is coupled to each of the modules and is programmed to control the actuator assemblies to move the actuator assemblies between the retracted state and the plurality of extended states.

In accordance with further aspects, a system for displaying content includes a display device that has a base structure, a plurality of modules coupled to the base structure, with each of the modules including a plurality of actuator assemblies. Each of the actuator assemblies are individually controllable to move the actuator assemblies between a retracted state and a plurality of extended states. At least one light module is coupled to each of the modules, and a controller is coupled to each of the modules. The controller is programmed to control the actuator assemblies to move the actuator assemblies between the retracted state and the plurality of extended states. A computing device is configured to generate content for the display device and includes a memory and a processing unit encoding instructions that, when executed by the processing unit, cause the processing unit to control the actuator assemblies and the light modules.

In accordance with still further aspects of the disclosure, a method for controlling a display includes sending a first signal for controlling a plurality of actuator assemblies, with each of the actuator assemblies being individually controllable to move the actuator assemblies between a retracted state and a plurality of extended states. A second signal for controlling a plurality of light modules is also sent, with at least one of the light modules being coupled to each of the actuator assemblies. The first and second signals are synchronized to generate a desired effect on the display device.

DETAILED DESCRIPTION

The examples described herein are related to display devices used for advertising.

In some examples, the display devices incorporate lighting and movement. The lighting and movement are configured to catch a viewer's attention. This can enhance the impact of the brand shown on the display device.

Figure 1:
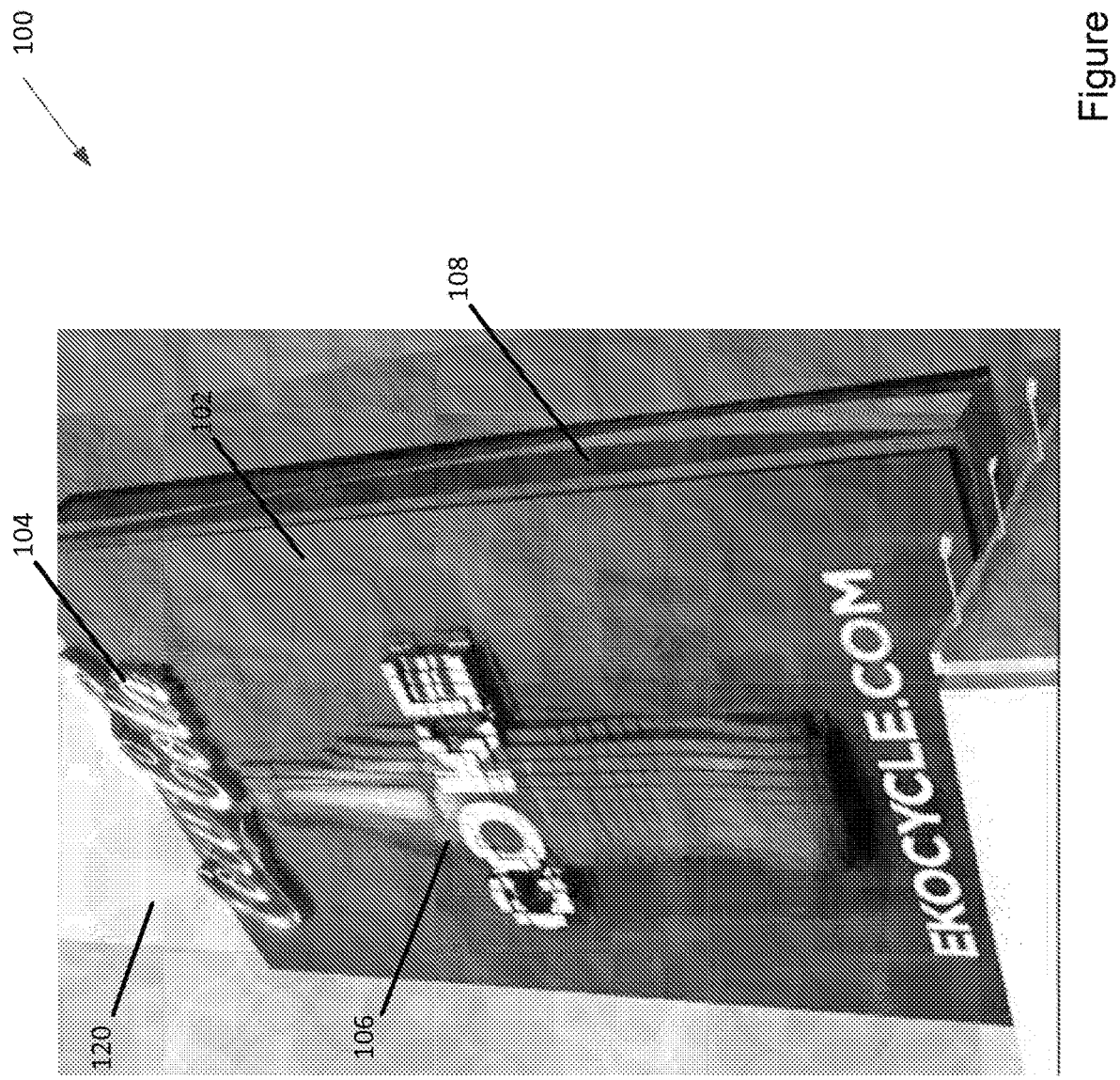
FIG. 1 is a perspective view of an example display device in an example environment.
Figure 2:
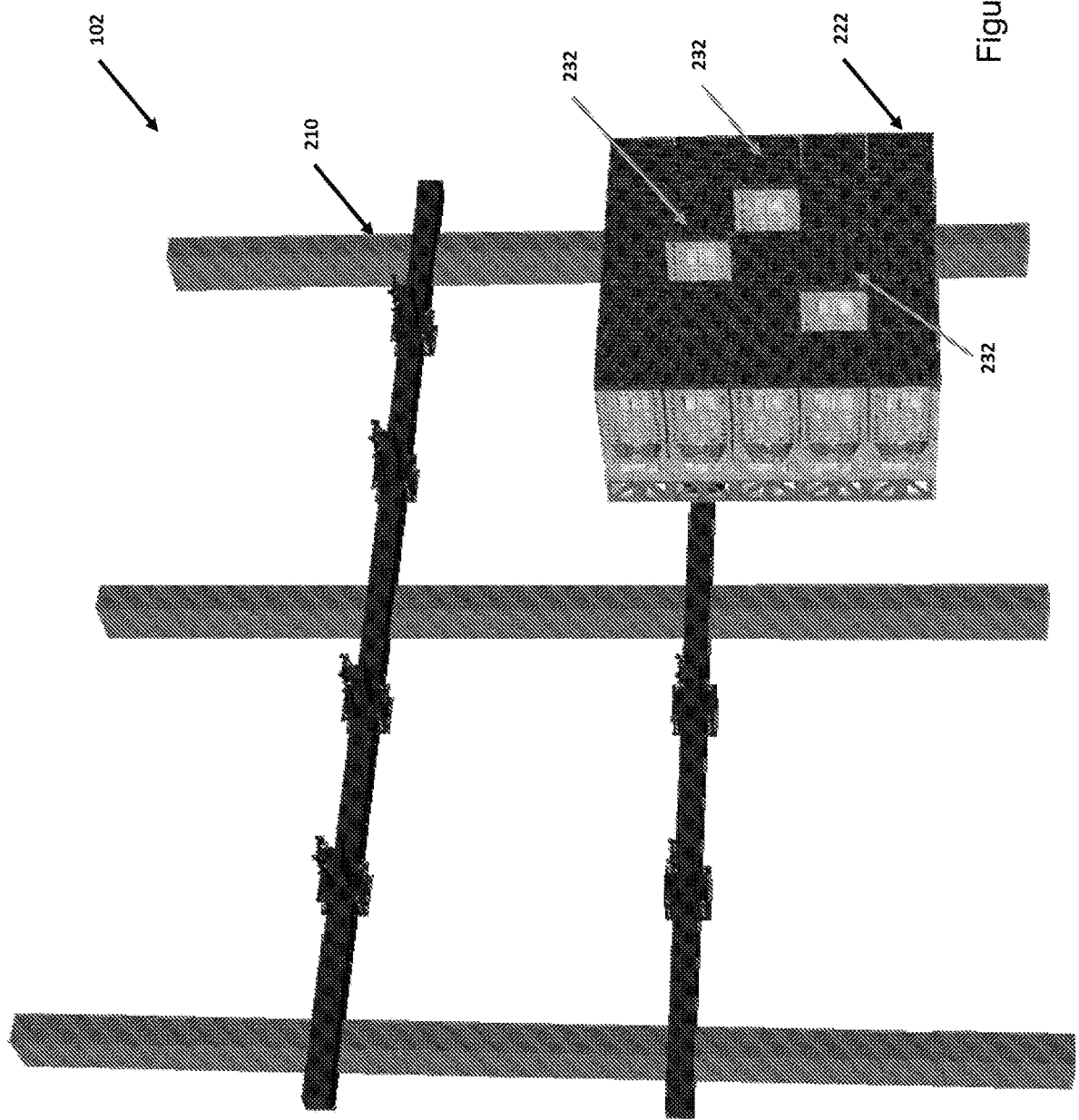
FIG. 2 is a perspective view of an example support structure and a module of the display device shown in FIG. 1.
Figure 3:
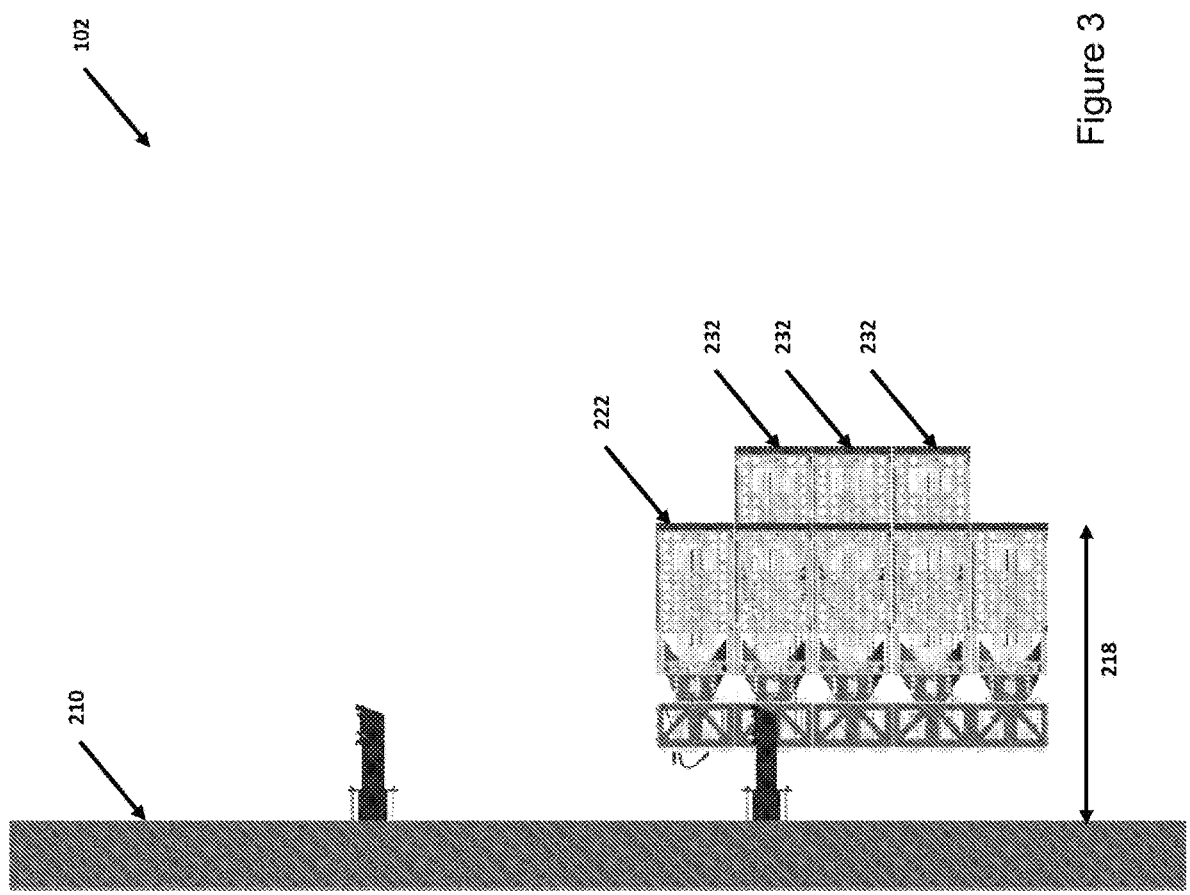
FIG. 3 is a side view of the support structure and module of FIG. 2.

Referring now to FIG. 1, an example display device 100 is shown. Generally, the display device 100 is mounted on the side 120 of a building. In other examples, the display device 100 can be mounted to other structures, such as a billboard structure, or can be configured to be freestanding.

The display device 100 includes a main display 102 and a side display 108. The main display 102 includes a stationary top channel logo area 104 (e.g., the stylized "Coca-Cola") and a dynamic area 106.

The main display 102 and the side display 108 can include lighting to enhance the impact of the display device 100. For example, as described further below, the main display 102 and the side display 108 can include a plurality of elements that are lit. In addition, the dynamic area 106 includes a plurality of actuator assemblies that move.

For example, as shown in FIGS. 2-3 and 15-17, the display device 100 includes a base structure 210 upon which a plurality of modules 222 are mounted. The base structure 210 is mounted to the structure upon which the display device 100 is mounted. The base structure provides structural integrity for each of the modules 222 coupled thereto. The base structure 210 also provides access to each of the modules 222 for service and repair, as described further below.

Each of the modules 222 includes a plurality of actuator assemblies 232 positioned therein. The use of individual modules 222 allows the display device 100 to be installed in an efficient manner, since the modules 222 can be moved and manipulated more easily than the entire display device 100. In this example, the modules 222 extend from the base structure 210 a distance 218 of approximately four feet, although modules of different sizes can be used.

The example depicted shows that each of the modules 222 includes a matrix of five rows of five actuator assemblies 232, for a total of 25 actuator assemblies 232 in each module 222. This configuration allows the actuator assemblies 232 in each of the modules 222 to function as a unit, thereby addressing changes in the environment, including stresses caused by the elements, such as wind, temperature, etc. Because each of the modules 222 functions as a unit, such stresses are accommodated across the actuator assemblies 232.

In alternative designs, the modules 222 can include more or fewer actuator assemblies 232. In the depicted embodiment, some of the actuator assemblies 232 are nonmovable (i.e., stationary), in that the actuator assemblies 232 remain in place and do not move like other actuator assemblies, as described further below. For example, in some embodiments the actuator assemblies 232 that are nonmovable may be placed in the area surrounding the top channel logo area 104. In some embodiments, the top two rows of the modules 222 may be stationary or otherwise have actuator assemblies that are nonmovable.

Figure 4:
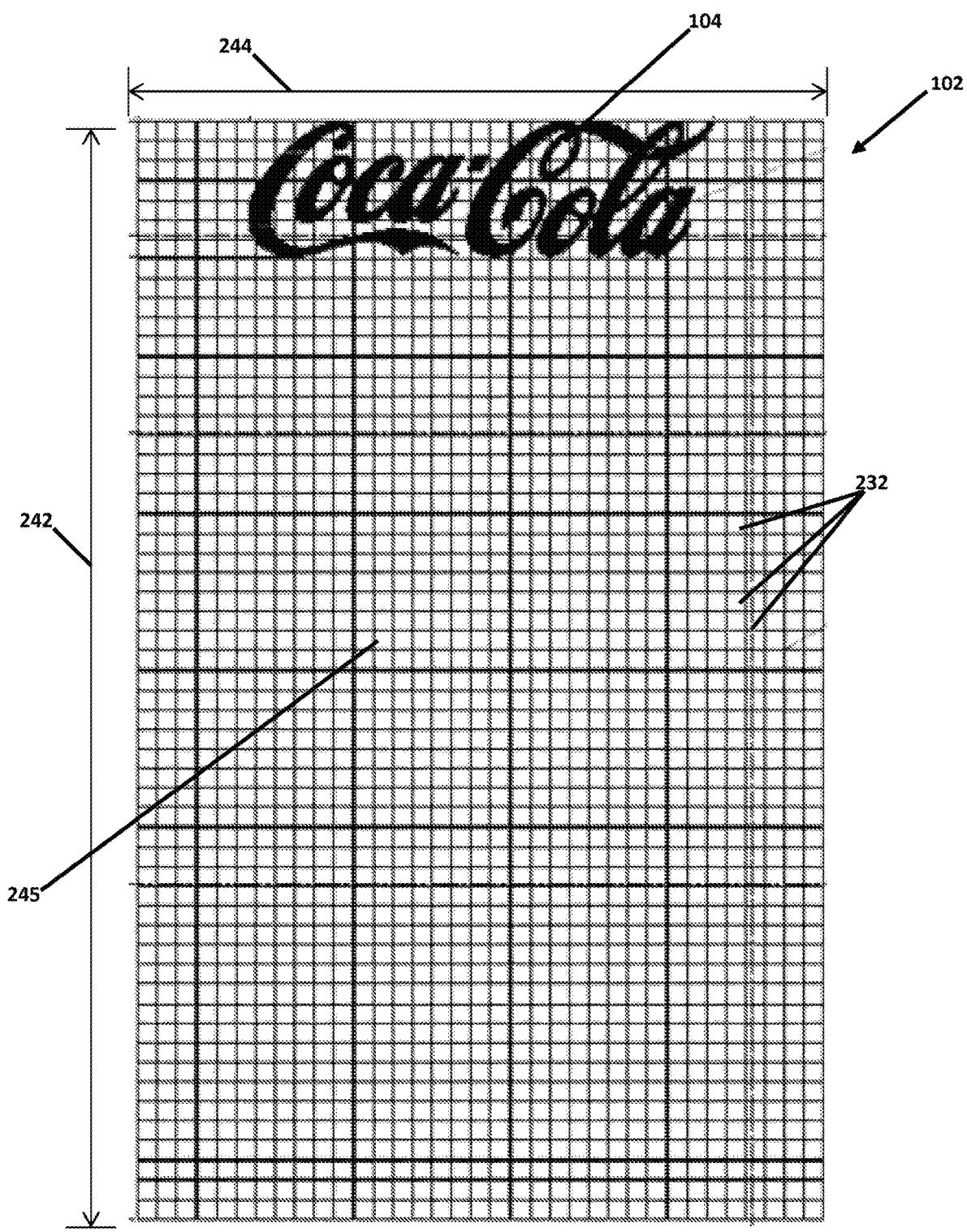
FIG. 4 is a front schematic view of the display device shown in FIG. 1.
Figure 5:
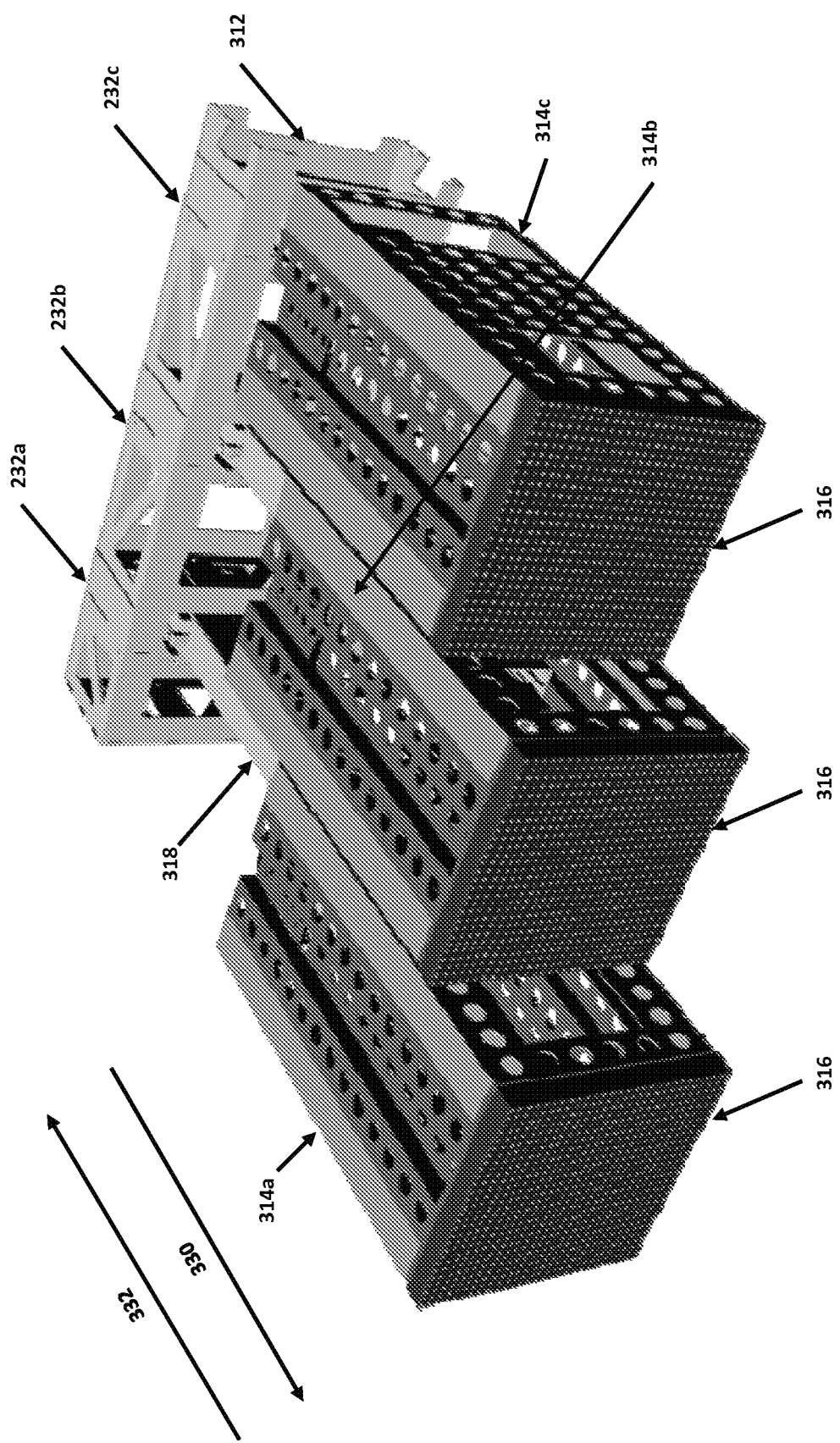
FIG. 5 is a perspective view of example actuator assemblies of the display device shown in FIG. 1.
Figure 6:
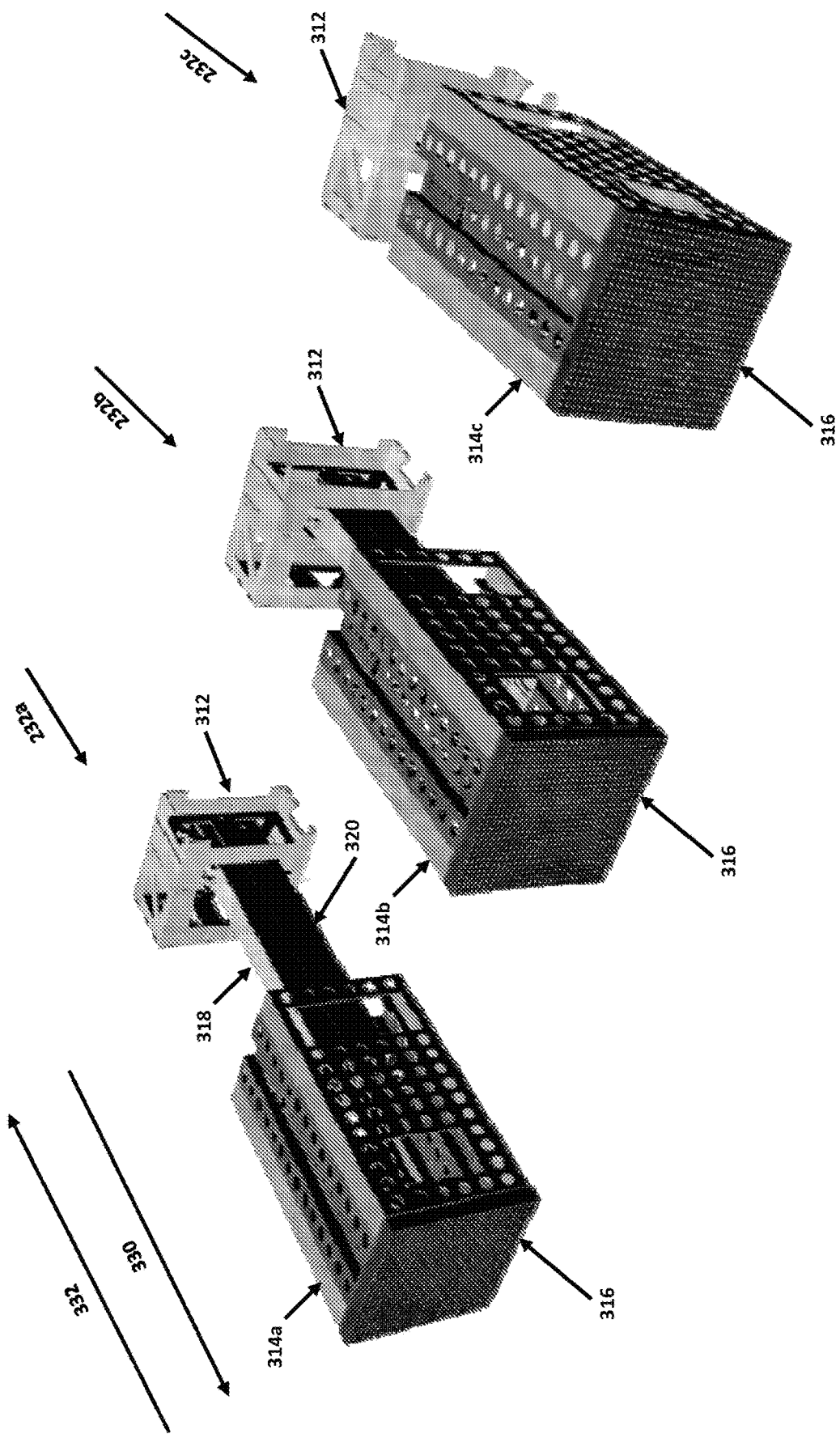
FIG. 6 is another perspective view of the actuator assemblies of FIG. 5.
Figure 7:
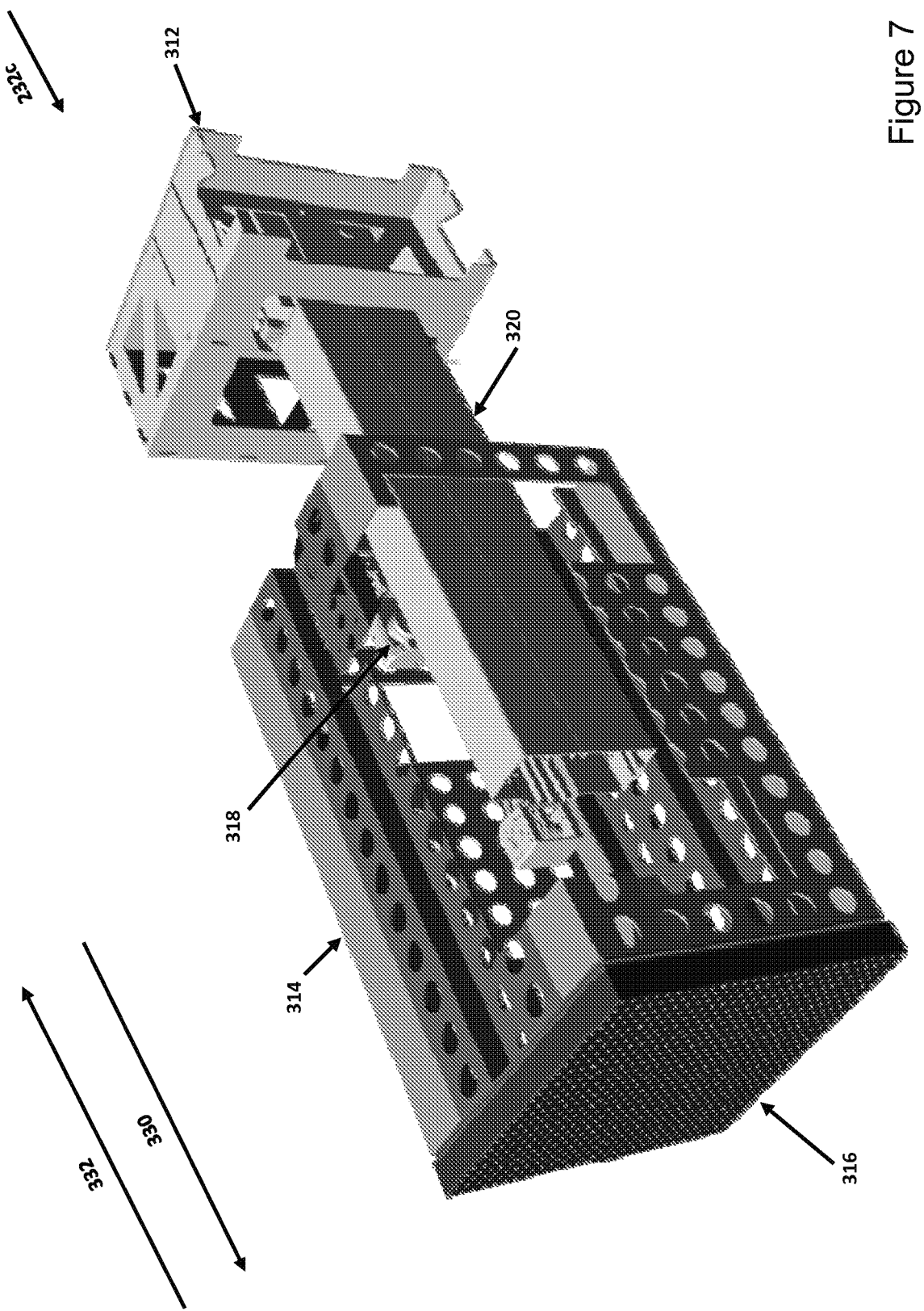
FIG. 7 is a perspective view of a single actuator assembly of FIG. 5.

Referring now to FIG. 4, the main display 102 is shown as made up of a plurality of the modules 222. In this embodiment, a height 242 of the main display 102 is 19.6 meters and a width 244 is 12.25 meters, although displays of other dimensions can be used. In this example, there are approximately 1,960 actuator assemblies 232, of which 1,715 are movable and 245 are nonmovable.

In this example, the main display 102 has a 12.5 millimeter LED pitch size (see FIGS. 18-19), a pixel density of 6,400 pixels per square meter, with a pixel configuration of 1R, 1G, and 1B per pixel. As described more below, the display has a large viewing angle, 16-bit color processing depth, and is controlled synchronously. Louvers tailored to the specific environment (e.g., based upon the sun density at a particular latitude) can be included to enhance the LED display during sunny conditions. The side display 108 can be similarly configured.

Figure 18:
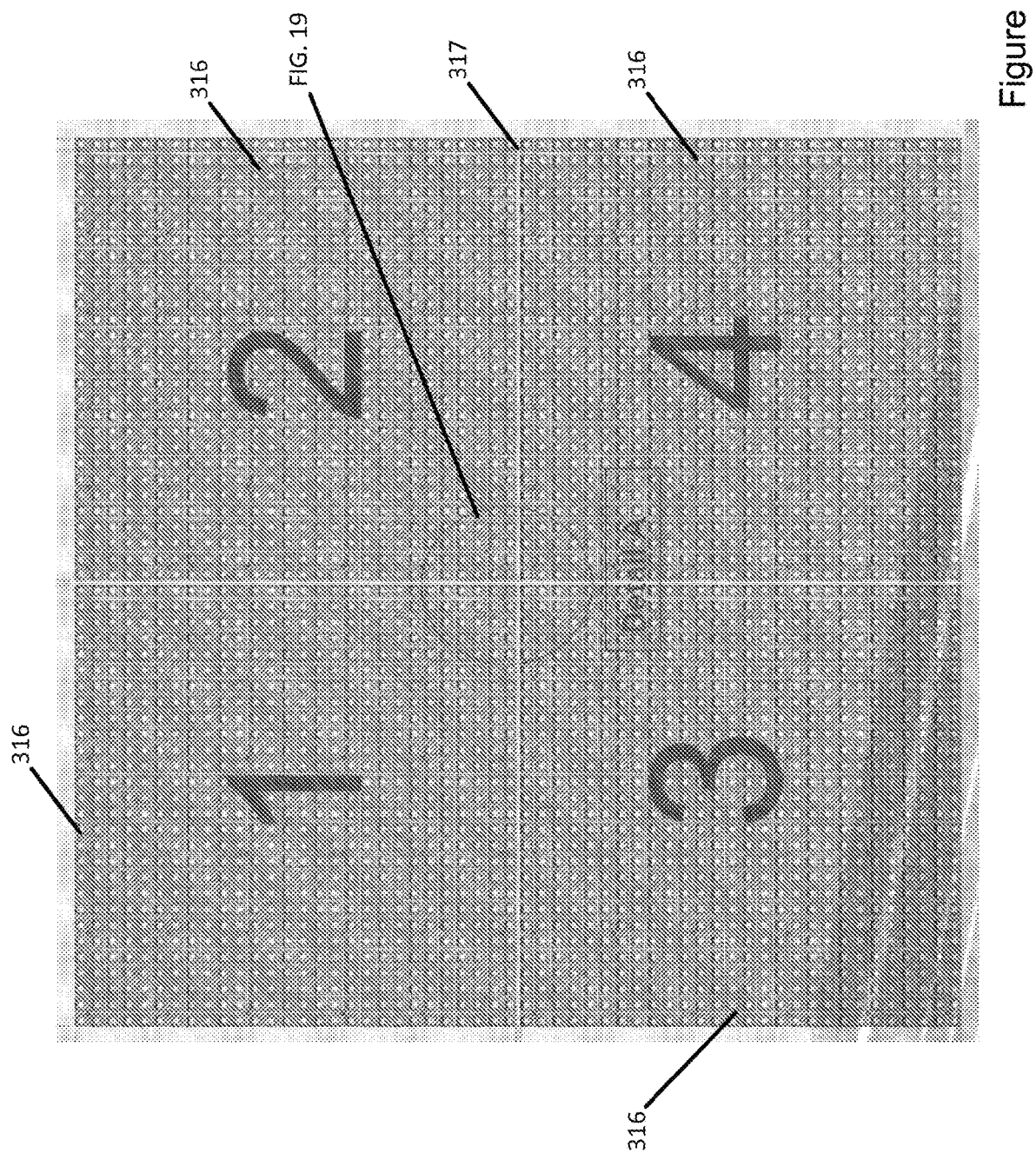
FIG. 18 is a plan view of four LED modules of the display device of FIG. 1.
Figure 19:
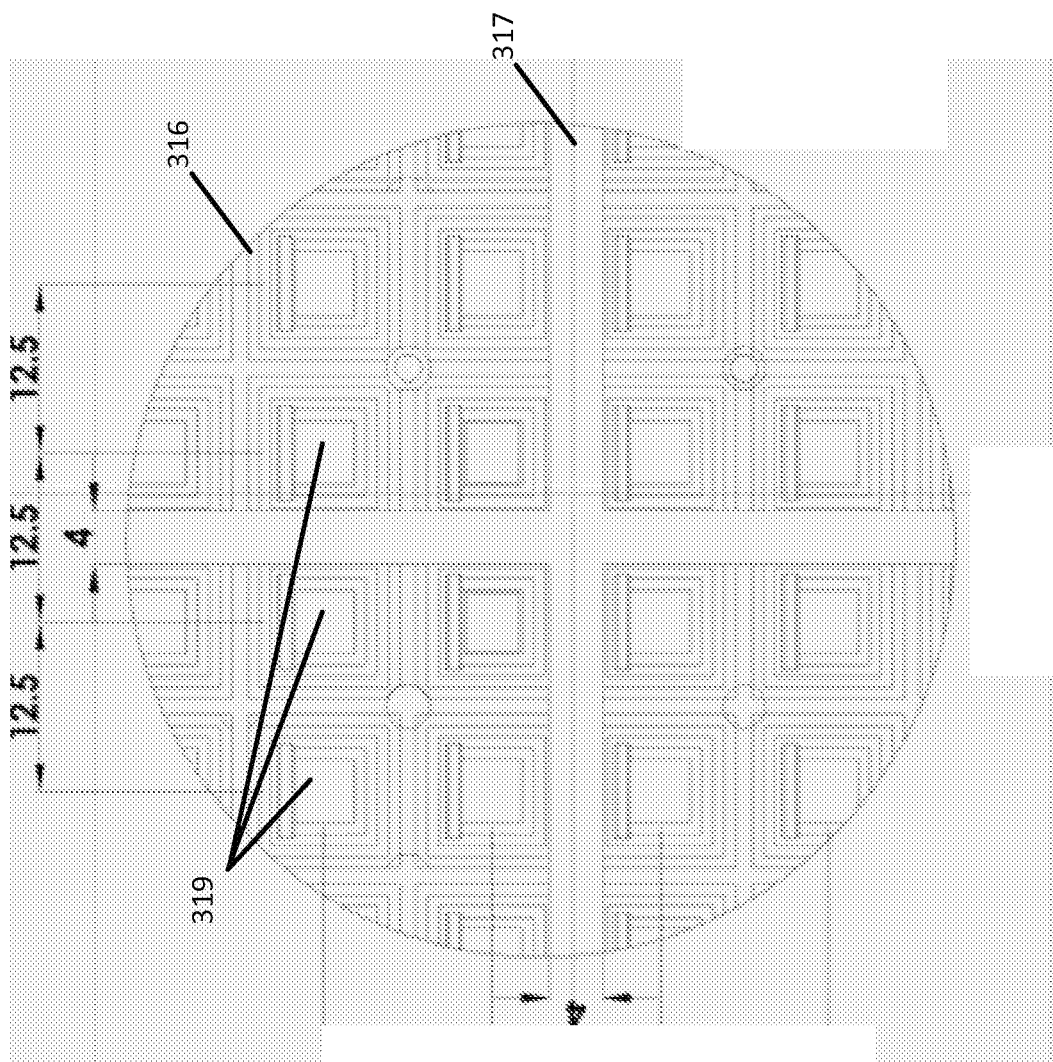
FIG. 19 is an enlarged view of the LED modules of FIG. 18.

For example, FIG. 18 shows four LED modules 316 positioned adjacent to one another. The pitch does not vary between LED modules 316, even with a provided gap, as described further herein.

Referring now to FIGS. 5-10, each of the actuator assemblies 232 is configured to move. Specifically, each of the actuator assemblies 232 includes a moving cube 314 movingly mounted to a core 312. The moving cube 314 is made of a plurality of aluminum extruded panels 314a, 314b, 314c, 314d (see FIG. 10) positioned about a holding tube 320. The moving cube 314 is configured to slide along the holding tube 320 in directions 330, 332.

The moving cube 314 is moved by a linear actuator assembly 318 in the directions 330, 332 in a plurality of extended positions. As depicted, the actuator assembly 232a is fully extended in the direction 330, the actuator assembly 232b is partially extended in the direction 330, and the actuator assembly 232c is fully retracted. In this example, the moving cube 314 moves approximately 20 inches when in the fully extended position, as depicted by the actuator assembly 232a.

Figure 8:
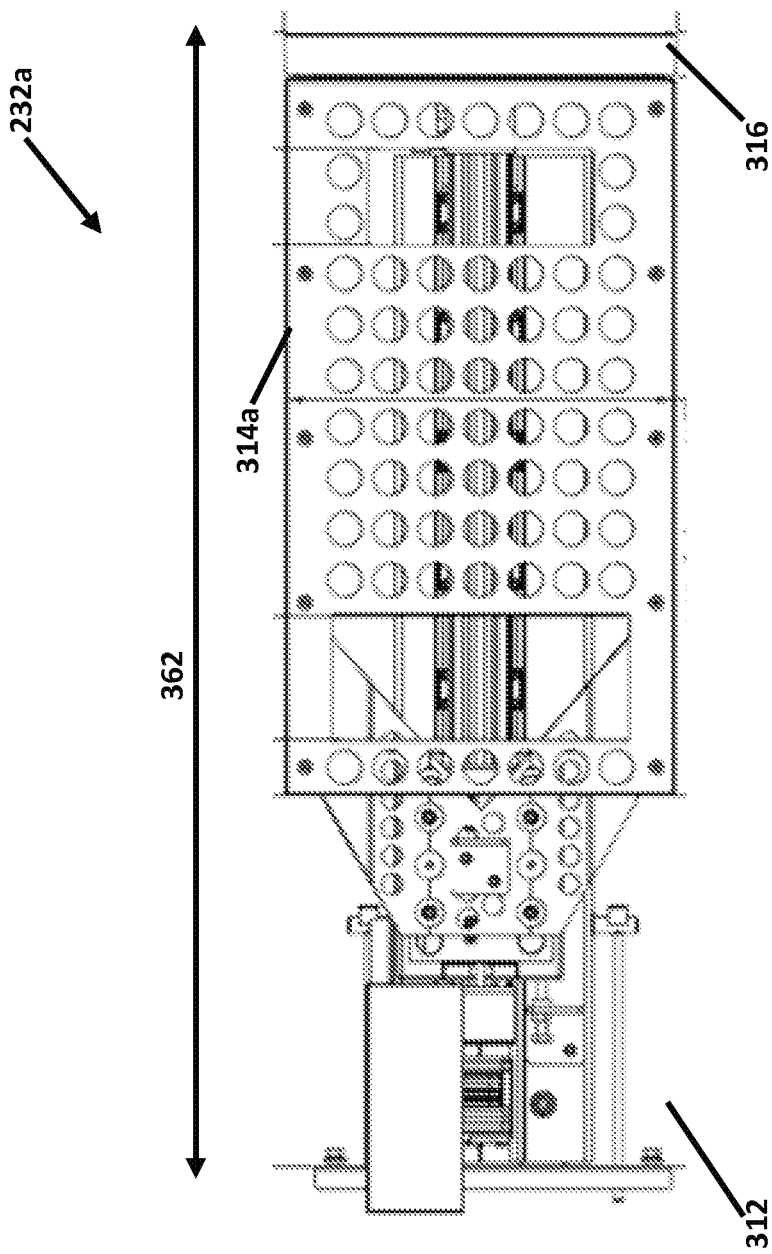
FIG. 8 is a side view of the actuator assembly of FIG. 7 in a retracted state.
Figure 9:
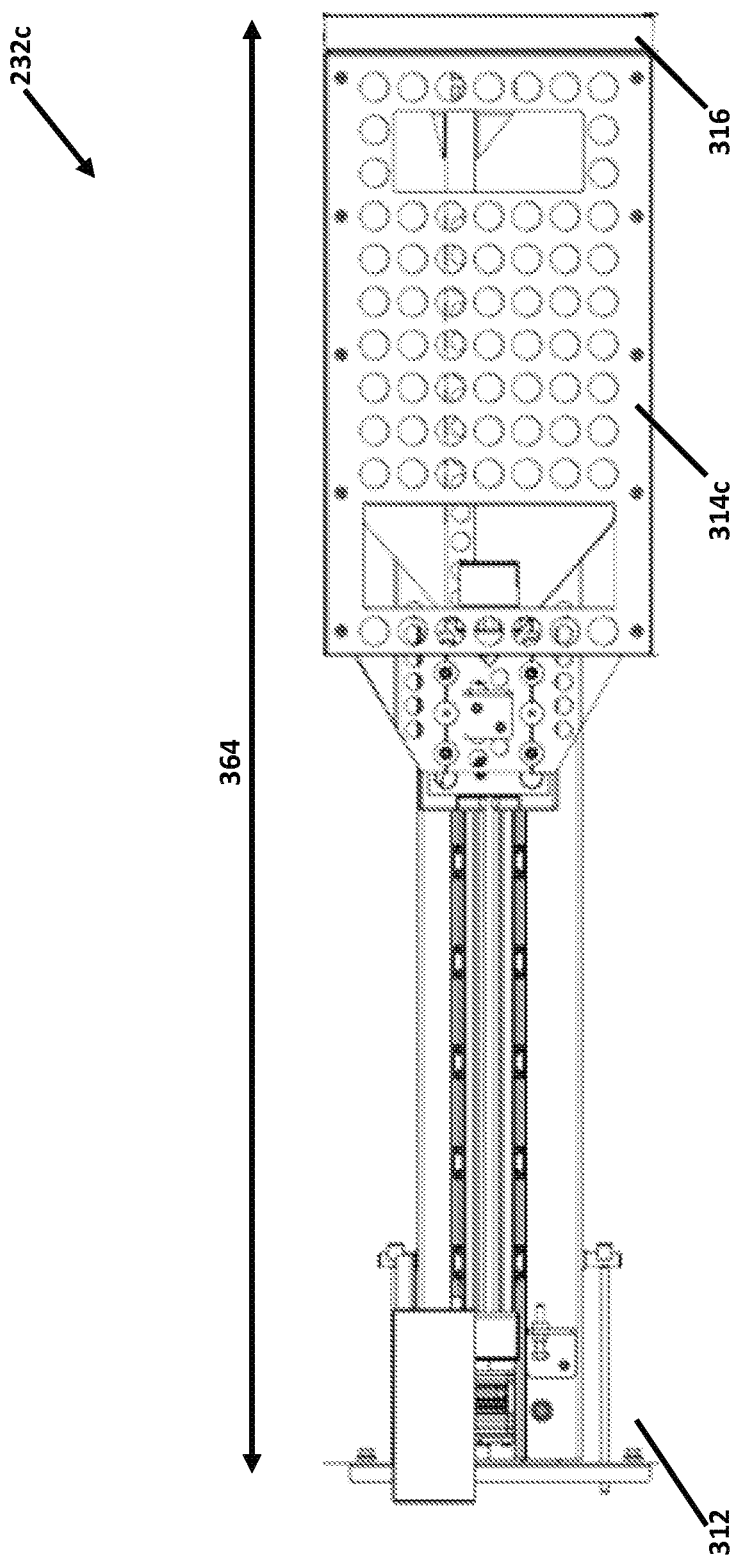
FIG. 9 is a side view of the actuator assembly of FIG. 7 in an expanded state.
Figure 10:
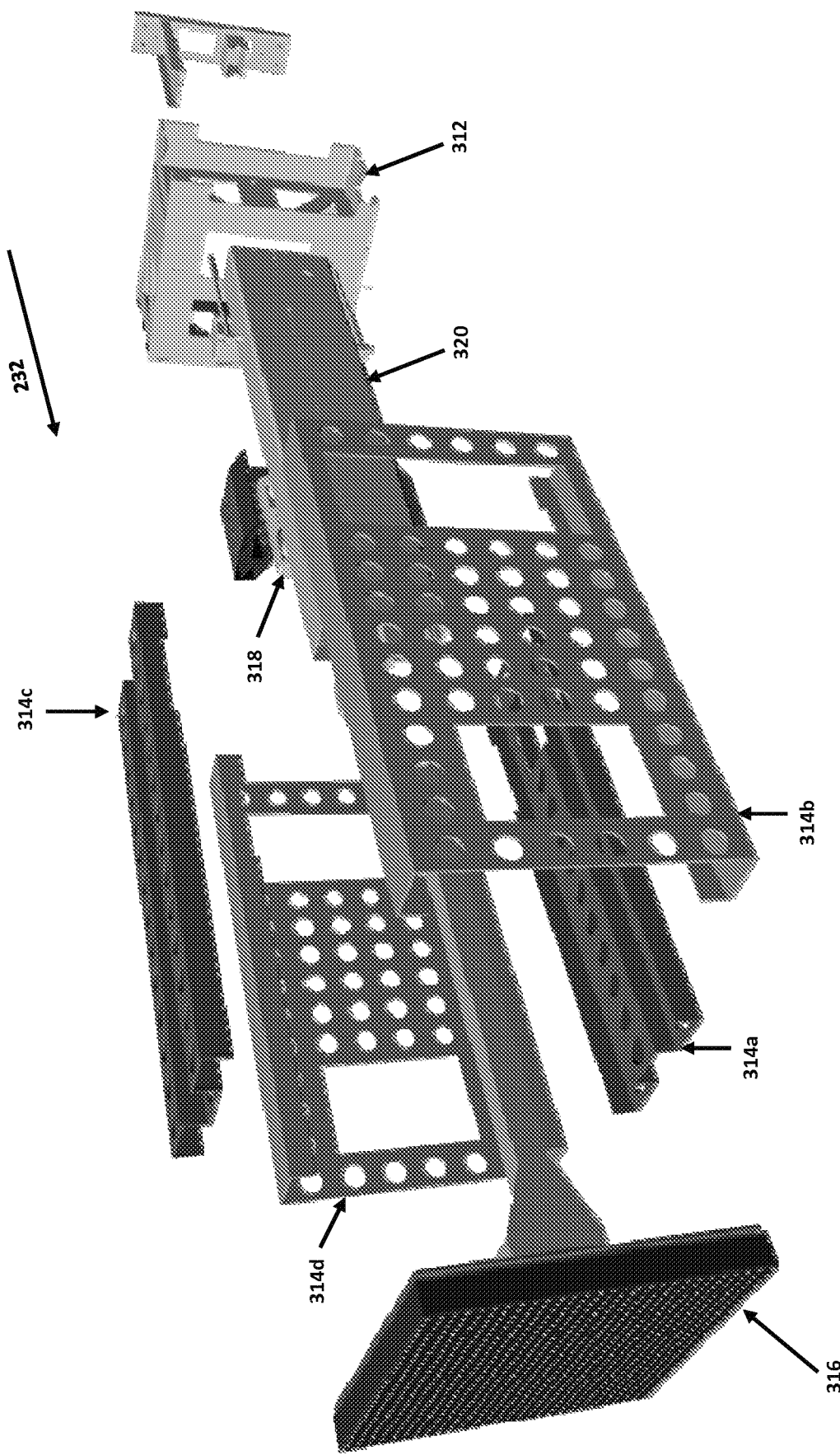
FIG. 10 is an exploded perspective view of the actuator assembly of FIG. 7.

For example, in the fully retracted state shown in FIG. 8, the actuator assembly 232a has a length 362 of approximately 1,000 millimeters. In the fully expanded state shown in FIG. 9, the actuator assembly 232c has a length 364 of approximately 1,500 millimeters. However, other lengths could be used depending on the amount of movement required. For example, the actuator assembly could be configured such that it extends more than about 20 inches or less than about 20 inches.

In this example, the linear actuator assembly 318 includes a driver with a servo motor. The servo motor is electrically controlled and moves the moving cube 314 in the directions 330, 332 to any of a plurality of extended positions. The movement can be precisely controlled, so that the position of the moving cube 314 is known. For example, in one embodiment, control is as precise as 0.0079 inches, with a position range of 1 to 29,000.

In some examples, the linear actuator assembly 318 is a F12-BC made by W-Robit of Taiwan. Such a linear actuator assembly 318 can drive up to 44 pounds, with a maximum drive speed of 40 inches per second. In another example, a PAC-UGT040D actuator made by PBC Linear of Roscoe, Ill., is used. The motor of the linear actuator assembly 318 is a BCH U04 Motor manufactured by Schneider Electric of Palatine, Ill. The motor includes a LXM23A servo driver system and Modicon M258 logic controller, both also manufactured by Schneider Electric. In still other examples, the motor is a SM23165DT motor made by Moog Animatics, of Santa Clara, Calif.

A Light-Emitting Diode (LED) module 316 is mounted to each of the moving cubes 314. The LED module 316 includes a plurality of LEDs, such as an NSSM032T LED module made by Nichia Corporation of Japan. Such an LED module is a 3-in-1 SMD LED, although other types can be used. In this example, the LED module 316 is 346 mm in height by 346 mm in width. The LED module 316 is configured to provide a plurality of colors, and each LED module 316 on each of the actuator assemblies 232 is individually controllable, as described below.

In example embodiments, the LED modules 316 can be configured to display one or a plurality of colors. For example, the LED modules 316 can be configured to display text, pictures, or other effects. By grouping the LED module 316, a larger effect, such as a larger picture or text, can be created on the main display 102.

In other embodiments, LED modules 316 could be placed on the sides (e.g., mounted on panels 314b and 314d), top (314c) and bottom (314a) of the moving cubes 314 near the end of the moving cubes 314. In such an embodiment, the light emitted from the LED modules 316 placed on the side, top and bottom of the moving cubes 314 could be seen when looking at the display device 100 from various angles. This embodiment, for example, would provide more continuous light when two adjacent moving cubes 314 are positioned at different distances and the display 100 is viewed from various angles.

In yet another alternative, the brightness of the lights in the LED modules 316 is configurable to create different appearances. For example, the lights can be dimmed or otherwise dulled to form depth and other visual effects, particularly around the edges of the display device 100.

A gap 317 (see FIGS. 18-19) is provided between adjacent LED modules 316. In one example, this gap 317 is four millimeters. This gap 317 is small enough so that it is indiscernible from the viewing distance for the display device 100. Further, the gap 317 is an air gap, so that any debris or other undesired materials does not get stuck between adjacent LED modules 316. Further, the gap 317 is configured to maintain the 12.5 millimeter pitch between adjacent LEDs 319.

Figures 20, 21, 22:
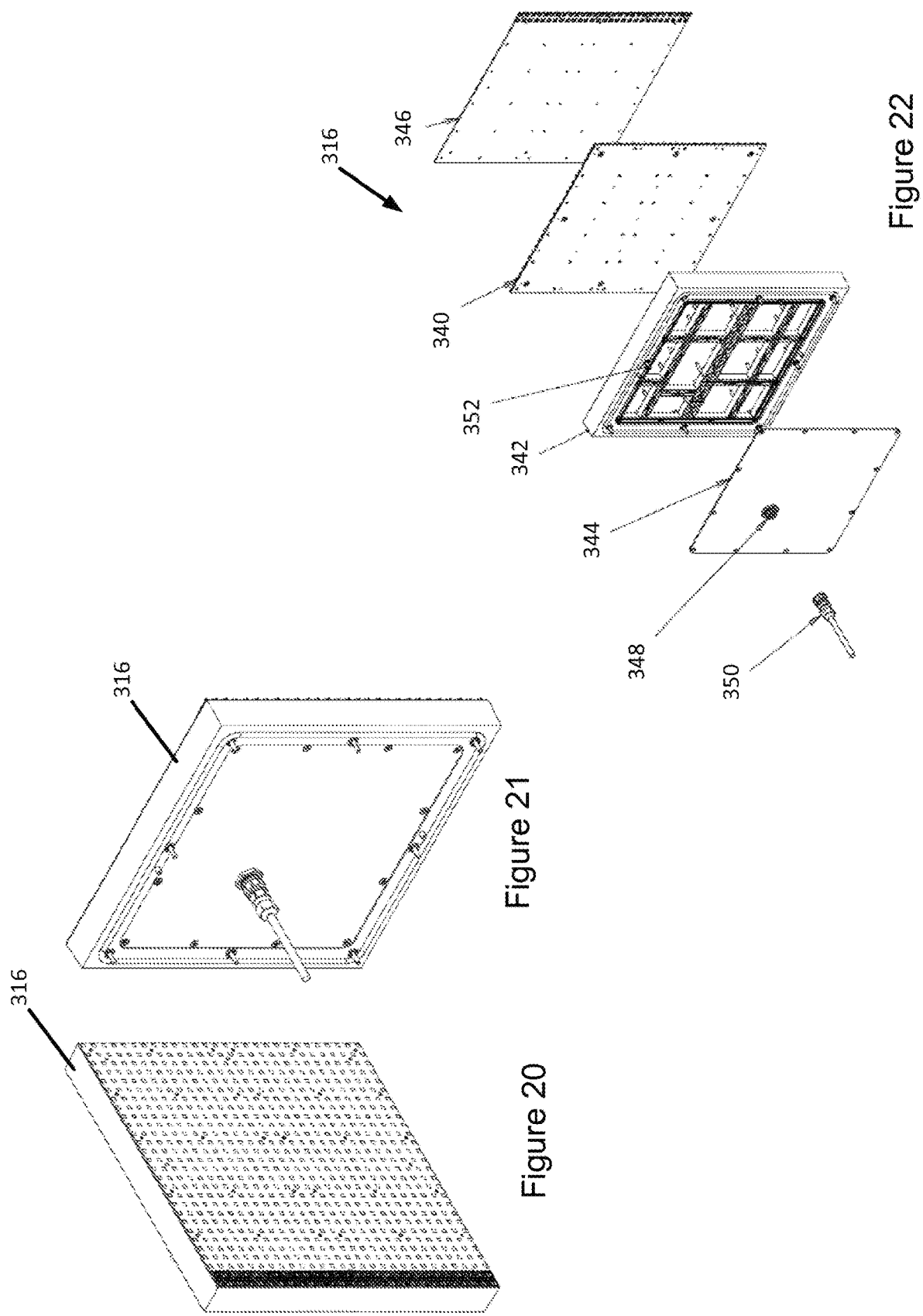
FIG. 20 is a first perspective view of a portion of the LED module of FIG. 12.
FIG. 21 is a second perspective view of the portion of the LED module of FIG. 20.
FIG. 22 is an exploded view of the portion of the LED module of FIGS. 20 and 21.

FIGS. 20-22 illustrate aspects of an example of the LED module 316. The illustrated LED module 316 includes a conduit 340 and conduit joint 342 sandwiched between two conduit brackets 344, 346. The conduit 340 provides the connections to the LEDs of the LED module 316. A wire clamp 348 connects a conduit bearing 350 to the conduit joint 342 and conduit 340 for coupling the conduit 340 and the LEDs connected thereto to a cable. One or more fasteners 352 fix the conduit 340 to the conduit joint 342.

Figure 24:
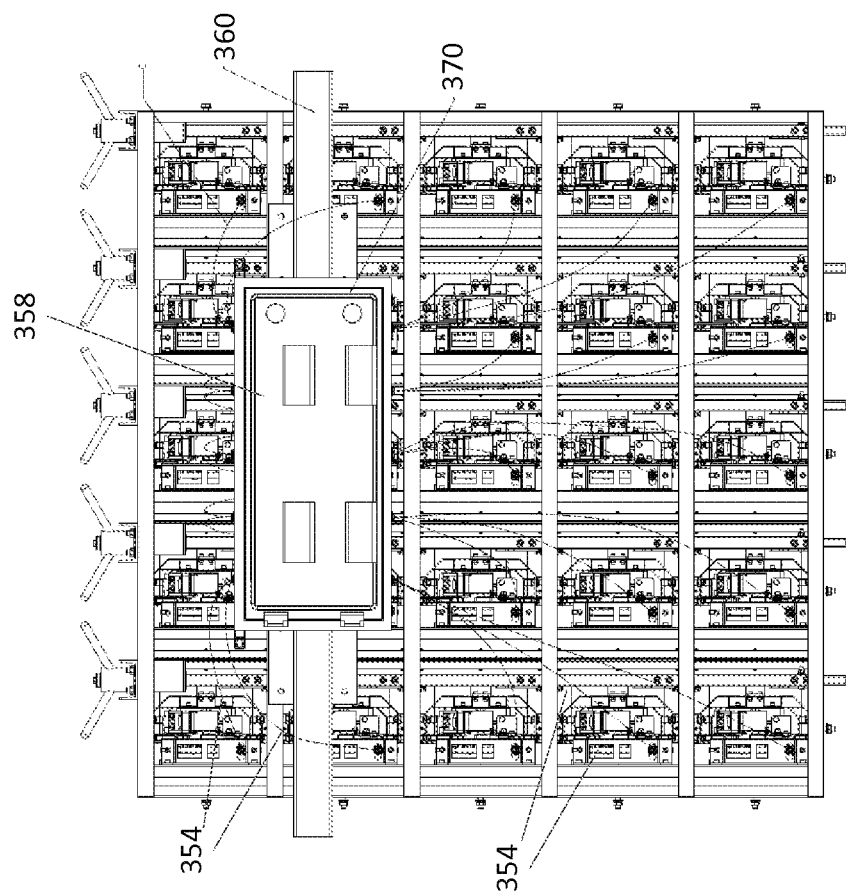
FIG. 24 is a rear view of the grid of the actuator assemblies of FIG. 23.
Figure 23:
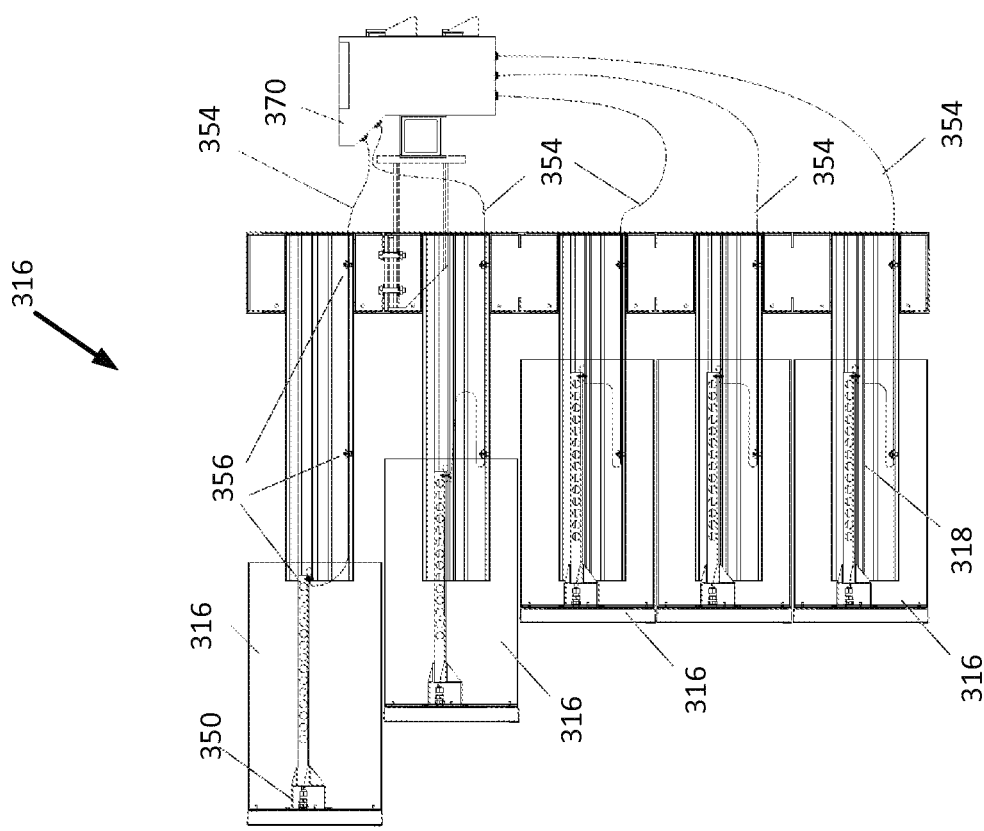
FIG. 23 is a side view of a grid of the actuator assemblies of FIG. 1.

FIGS. 23 and 24 illustrate further aspects of an example of the LED modules 316 arranged in the matrix of five rows and five columns of modules 316. A cable 354 connects each LED module 316 to a local controller 370. Each LED module 316 has a cable 354 connected between the conduit bearing 350 and the local controller 370. One local controller 370 is provided for each matrix of 25 LED modules 316 as shown in FIG. 24. The local controller 370 is supported, for example, on the base structure 210. In the illustrated embodiment, the local controller 370 is mounted on a horizontal transom 360 of the base structure 210. Each cable 354 has a sufficient length so as to allow the LED module 316 to remain connected to the local controller 370 in its fully extended position and its fully retracted position. The cables 354 are fastened to various portions of the linear actuator 318 to stow the cable 354 as desired to allow the LED module to move as desired.

Figure 17:
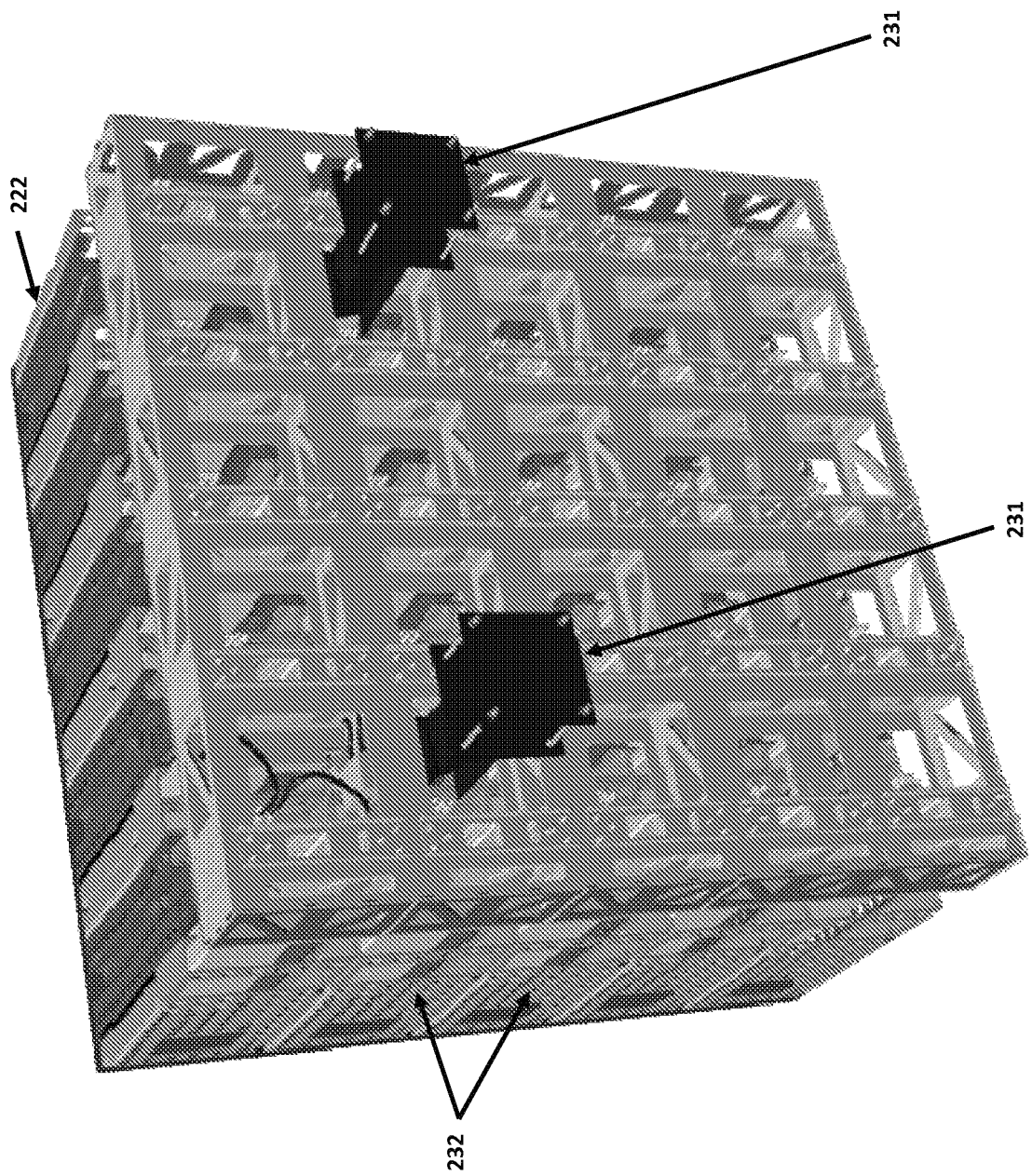
FIG. 17 is another rear perspective view of the module of FIG. 2.

In these examples, the construction of the actuator assemblies 232 allows for ease in access and maintenance. Specifically, the way the actuator assemblies 232 are coupled to the modules 222 allows individual actuator assemblies 232 to be removed individually from a rear of the display device 100. For example, FIG. 17 depicts a rear view of one of the modules 222, from which the actuator assemblies 232 are accessible.

Figure 11:
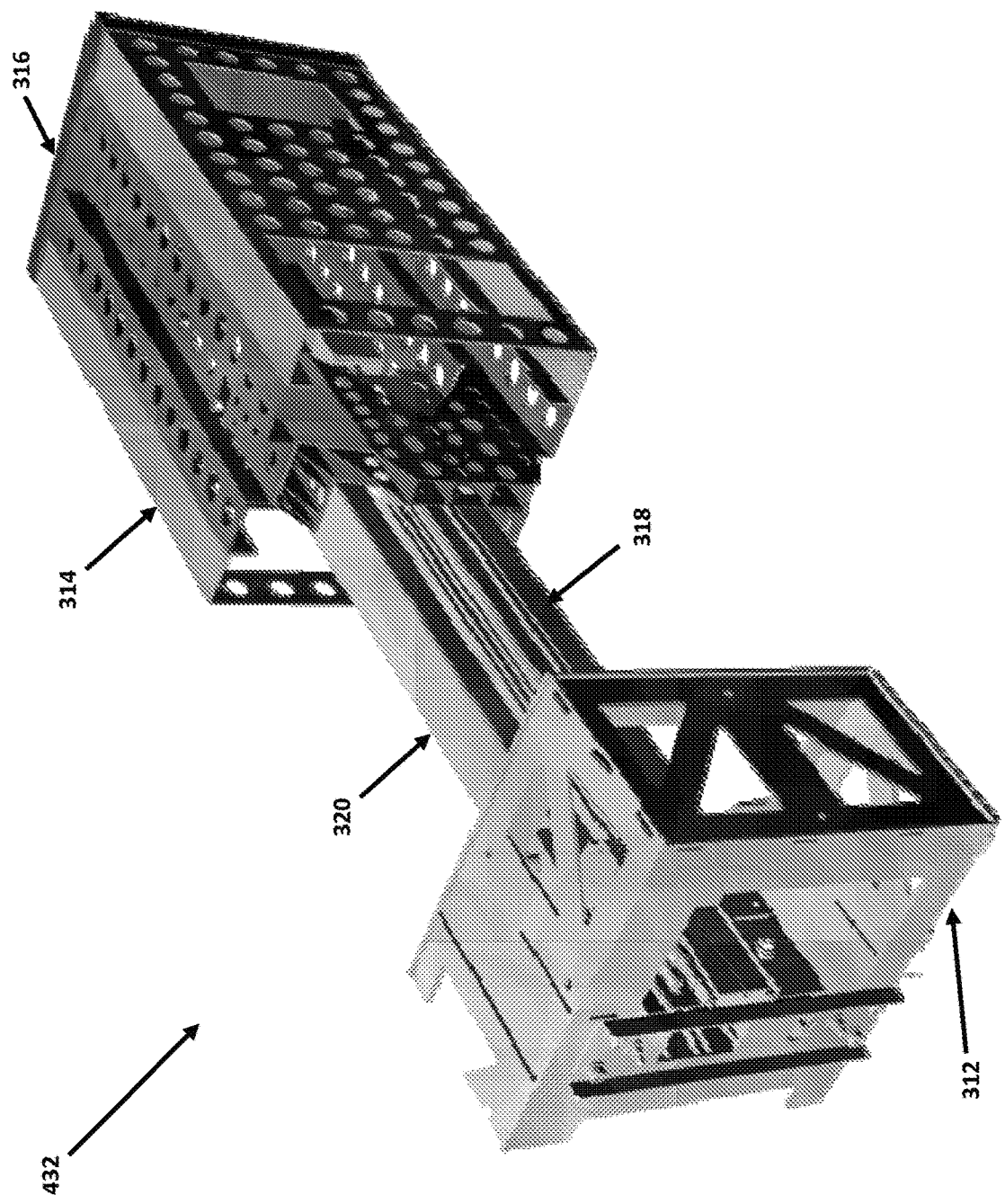
FIG. 11 is a perspective view of another example actuator assembly.
Figure 12:
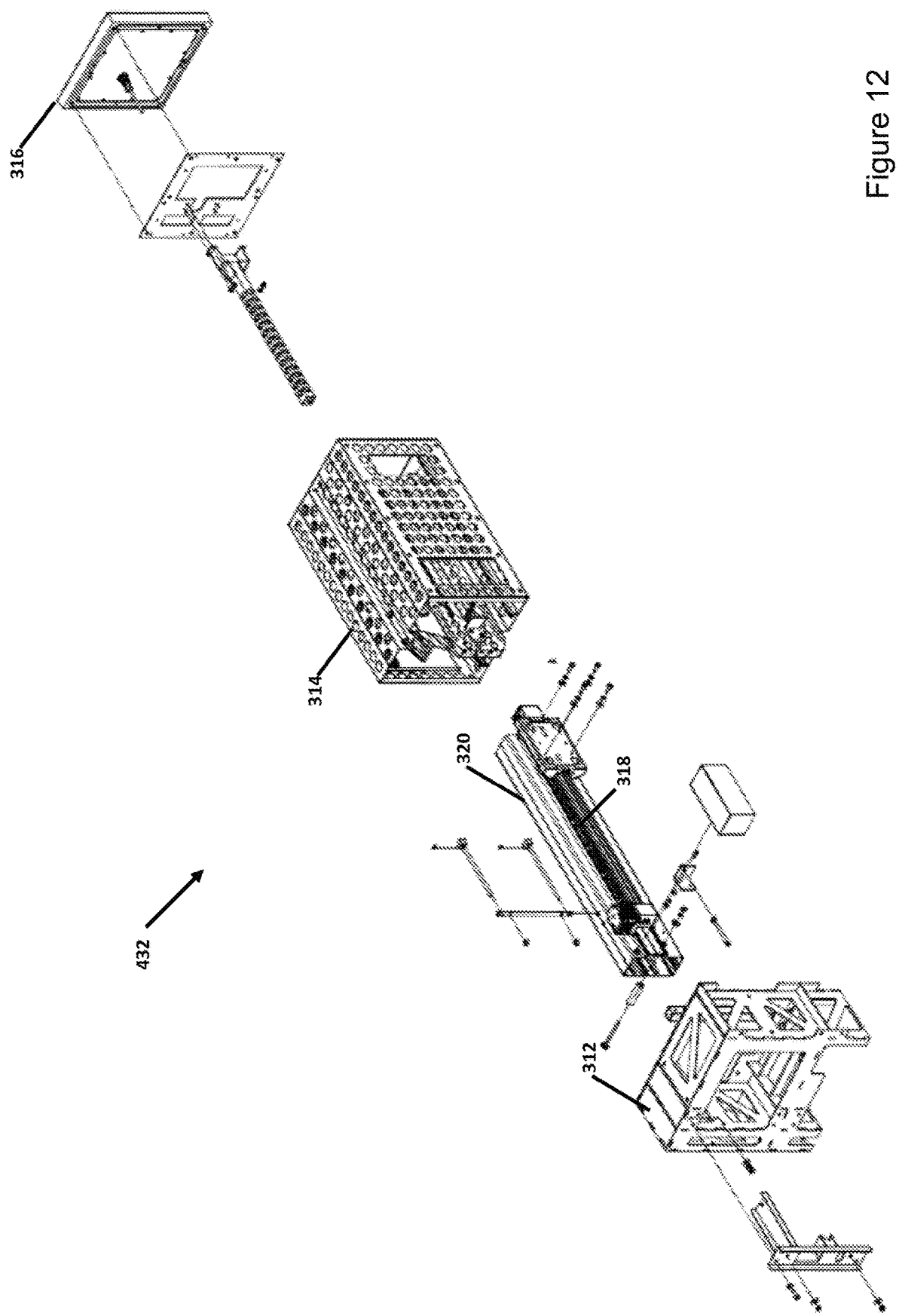
FIG. 12 is an exploded perspective view of the actuator assembly of FIG. 11.

Referring now to FIGS. 11-12, an alternative linear actuator assembly 432 is shown. The actuator assembly 432 is similar to the actuator assembly 232 described above, except that the linear actuator assembly 318 is mounted to a side of the holding tube 320.

Referring again to FIGS. 15 and 16, some examples of the display device 102 include a mechanical locking arrangement for securely locking the actuator assemblies 232 in the retracted state. This could be desirable, for instance, during extremely severe weather. A rod latch 250 is slidably mounted adjacent a rear portion of the actuator assemblies 232 with a plurality of mounting brackets 252. One of the rod latches 250 extends down each column of actuator assemblies 232. Thus, the illustrated module 222 includes five rod latches 250 corresponding to the five columns of actuator assemblies 232. In some examples, each of the rod latches 250 extend down the entire column of the active portion 106 of the display device 100. At the top of the module 222, an actuator 254 is rotatably supported by the base structure 210. Each of the rod latches 250 is connected to a respective one of the actuators 254 such that the rod latches 250 move linearly up and down in response to movement of the actuators 254. The rod latches 250 include a plurality of latch hooks 256 attached thereto. Each of the rod latches 250 has a number of latch hooks 256 attached thereto corresponding to each row of the module 222. Thus, in the illustrated example, five latch hooks 256 are shown connected to each rod latch 250. In embodiments where the rod latches 250 extend down the entire columns of active portion 106, there would be a latch hook 256 for every row of actuator assemblies 232 in each module 222.

The rod latches 250 are movable via the actuators 254 to move the rod latches 250 to selectively engage the latch hooks 256 into and out of engagement with the corresponding actuator assemblies 232. In the illustrated example, the rod latches 250 are threadably received by the base structure 210, such that rotating the actuators 254 in one direction moves the rod latches 250 up, and rotating them in the other direction moves the rod latches 250 down. In the example shown in FIGS. 15 and 16, when one of the rod latches 250 is moved upwards by the actuator 254, the latch hooks 256 engage the actuator assemblies to mechanically lock them in place.

The display device 100 may include various other features to obtain and hold the attention of individuals capable of viewing the display device. These features could be facilitated by an interactive module 245 located on the display device 100 or be operably connected to it. For example, the interactive module 245 may include or be operably connected to sensors such as, microphones, cameras, motion detectors, moisture sensors, light sensors, etc. Additional features may include speakers, lasers, or other devices capable of producing light shows, which could also be used to attract and hold the attention of individuals. Such features could be operated separately or may be integrated with other sensors such that the display device 100 choreographs its display depending on input from the various sensors of the interactive module 245. For example, the interactive module 245 can include speakers and lasers controlled by a computing device that can choreograph the various sensors, speakers, or lasers to make the display device more attractive and entertaining.

In other examples, sensors, such as moisture, wind, temperature, etc. sensors, can be used to detect certain weather patterns. For example, the sensors can be used to detect certain weather conditions in which operation of the actuator assemblies is not advisable (icing conditions or extreme wind conditions, specifically). In such scenarios, the sensors detect the adverse weather condition and stop movement of the actuator assemblies until such time as the detected weather state passes. In some implementations, a delay period is included such that movement of the actuator assemblies is not restarted until some predetermined time passes in which the adverse weather condition is not detected. This prevents the actuator assemblies from repeatedly starting and stopping, for example, during periods of variable wind gusts.

In other examples, the interactive module 245 is programmed to transmit sound (e.g., music, voice, advertisements) so that passers can tune to a particular radio frequency to listen on their radios. In yet other examples, the interactive module 245 can be programmed to communicate wirelessly (e.g., through Bluetooth or via the Internet) with viewers' smartphones. In this example, the viewer can access content, such as a web site, that allows the viewer to upload or otherwise stream content that can be displayed on the display device 100. Such content could be pictures, etc.

In another example, the interactive module 245 could include microphones such that it could pay "live" sound. Such microphones could be directionally focused such that they could focus in on a particular sound source. In this regard the display device could include software such that the display device could be interactive with those viewing the display device's advertisement based on any number of factors such as movement, sound, recognizing elements in its surroundings, etc.

Figure 13:
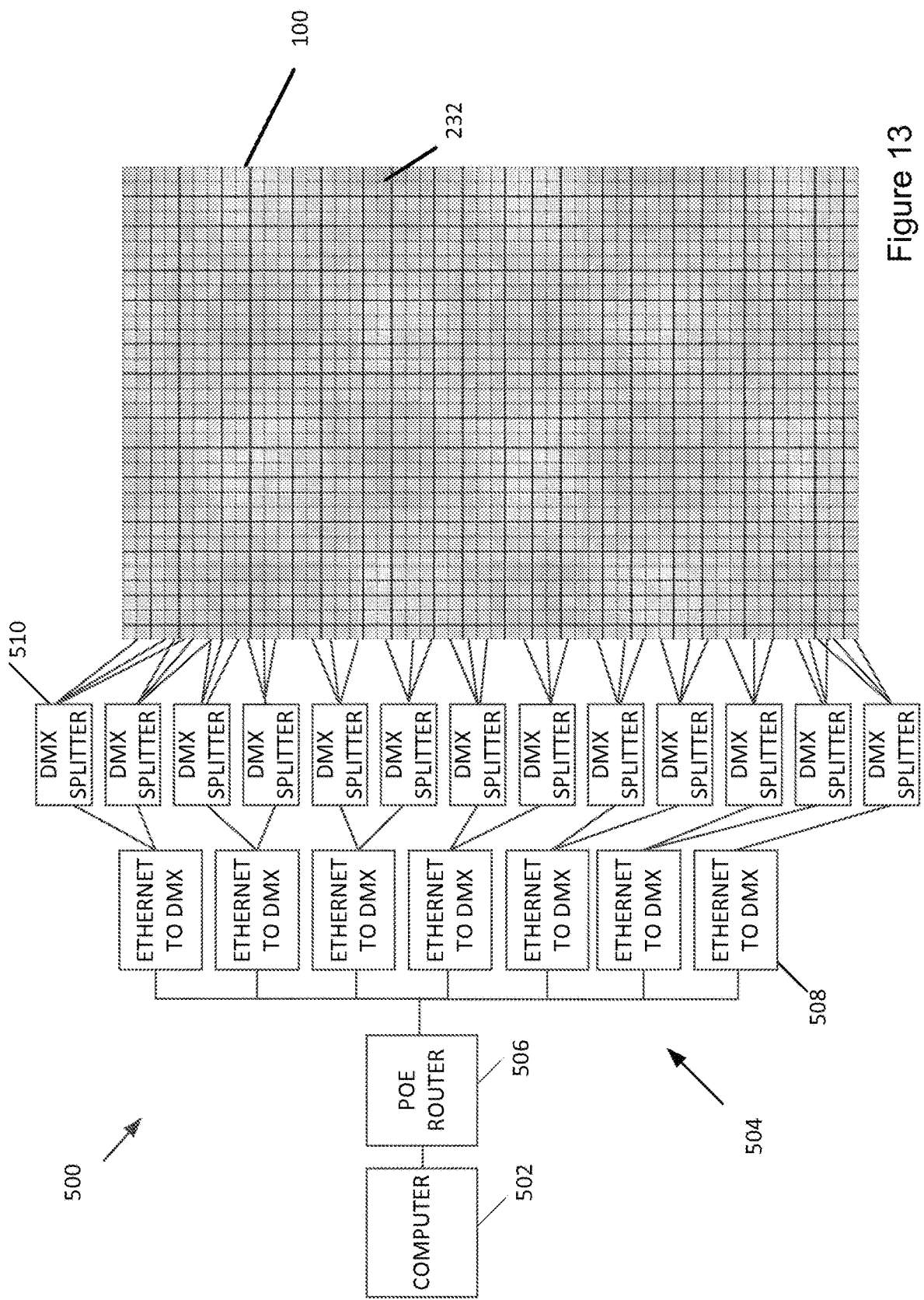
FIG. 13 is a schematic view of an example system for controlling the display device of FIG. 1.

Referring now to FIG. 13, an example system 500 for controlling the display device 100 is shown. In this example, a computing device 502 communicates with each of the actuator assemblies 232 through a network 504. Specifically, the computing device 502 communicates through a router 506 to a plurality of Ethernet to DMX converters 508 which, in turn, communicate with the display device 100 through a plurality of DMX splitters 510. Other configurations are possible.

In this example, the computing device 502 is a local or remote computing device, such as a desktop, laptop, or tablet computer. The computing device 502 can use a standard communication protocol, such as DMX, CANOPEN, Ethernet or RS485 interface, to control the display device 100.

The control by the computing device 502 can include programming the movement of each of the actuator assemblies 232. In one example, an application programming interface (API) is provided that assists in the programming of the movement of the actuator assemblies 232.

In one example, the linear actuator assembly 318 is controlled by the computing device 502 according to a percentage of extension for the moving cube 314. For example, the computing device 502 defines a percentage, such as 0 percent, 10 percent, 25 percent, 50 percent, 75 percent, and/or 100 percent for the moving cube 314 at a given point in time. The percentage is translated to instructions transmitted to the appropriate linear actuator 318 to extend or retract the moving cube 314 the desired amount. By defining a changing percentage over time, the movement of the moving cube 314 can be choreographed, as desired.

In addition, the computing device 502 can define colors to be displayed by the LED module carried by the moving cube 314. The colors of the LEDs on the LED modules 316 can be changed to create the desired effect.

Since each of the actuator assemblies 232 can be individually controlled separately, the movement and color of each of the actuator assemblies 232 can be controlled to create patterns or other visual effects for the display device 100.

For example, the actuator assemblies 232 in a certain area of the display can be extended and retracted in coordination to give the appearance of movement of the display device 100. In one such example, the actuator assemblies 232 are controlled to provide a wave-like effect across the display device 100. In another example, the control is randomized, so that the actuator assemblies 232 move in random patterns. Other configurations and patterns are possible.

By controlling the display device 100 in this manner, the overall visual impact of the display device 100 is increased. Specified patterns can be used to further enhance the visual effect of the display device 100, thereby catching the eye of a viewer.

In some examples, the patterns are configured to make certain shapes and depictions. For example, as shown in FIG. 1, the actuator assemblies 232 in the dynamic area 106 are patterned to represent the shape of a contoured bottle. To accomplish this, each of the actuator assemblies 232 is controlled to extend and/or retract a certain distance to form the pattern of the bottle. An endless number of shapes and depictions can be created in this manner. In addition, the shapes can be used to morph over time into a choreographed series of shapes.

For example, the computing device 502 can be programmed to create various shapes on the display device 100 depending on the time of day, as well as control the sequence of those shapes. The sequence can be choreographed or randomized, as desired. For example, in one embodiment, the computing device 502 can control the sign to depict fluid flowing out of a bottle. Many other examples are possible.

In addition, the computing device 502 may also control other aspects of the display device 100, such as microphones, speakers, cameras or other sensors, such as motion detectors, light sensors, and moisture sensors. For example, the computing device 502 could be configured such that it controls cameras located on or near the display device 100 such that it could display images or video a camera captures. The computing device 502 may also control speakers located on or near the sign such that it can play music or other desired sounds, such as sounds obtained by a microphone. Thus the display device 100 would be able to play stored sound, stream sound from the internet, or also play "live" sound detected by the microphone.

In addition, the computing device 502 may be equipped with video recognition software such that, for example, the camera could recognize a passerby and focus on and display that individual on the display 100. In addition, the computing device may be configured or programmed to play stored sounds at relevant times to communicate with, for example, the individual being displayed on the display device 100 by also controlling the speakers to project relevant sounds, slogans or speech. In this aspect of one example embodiment the computing device 502 allows the sign to be interactive with those in its surroundings and drawing more attention to the display device 100.

The computing device 502 may also control other sensors placed on the display, such as for example, motion detectors, light sensors, and moisture sensors. The display device may also include lasers that can be controlled by the computing device 502 such that the display device can produce a laser light show. The computing device may also integrate one or more of the sensors, or the information obtained therefrom, speakers, lasers, etc. to work in combination to enhance the display device 100. In yet another example embodiment of the display 100, the computing device 502 could be connected to the Internet and obtain a variety of information and display it on the display 100, such as weather, news, etc. Such sensors, such as a light sensor, could be used to adjust the brightness of the display device 100, for example, to adjust the brightness of the LEDs depending on the weather or time of day or night. Likewise the microphones could also be used to adjust the volume of the speakers to the appropriate level given the particular surroundings.

Figure 14:
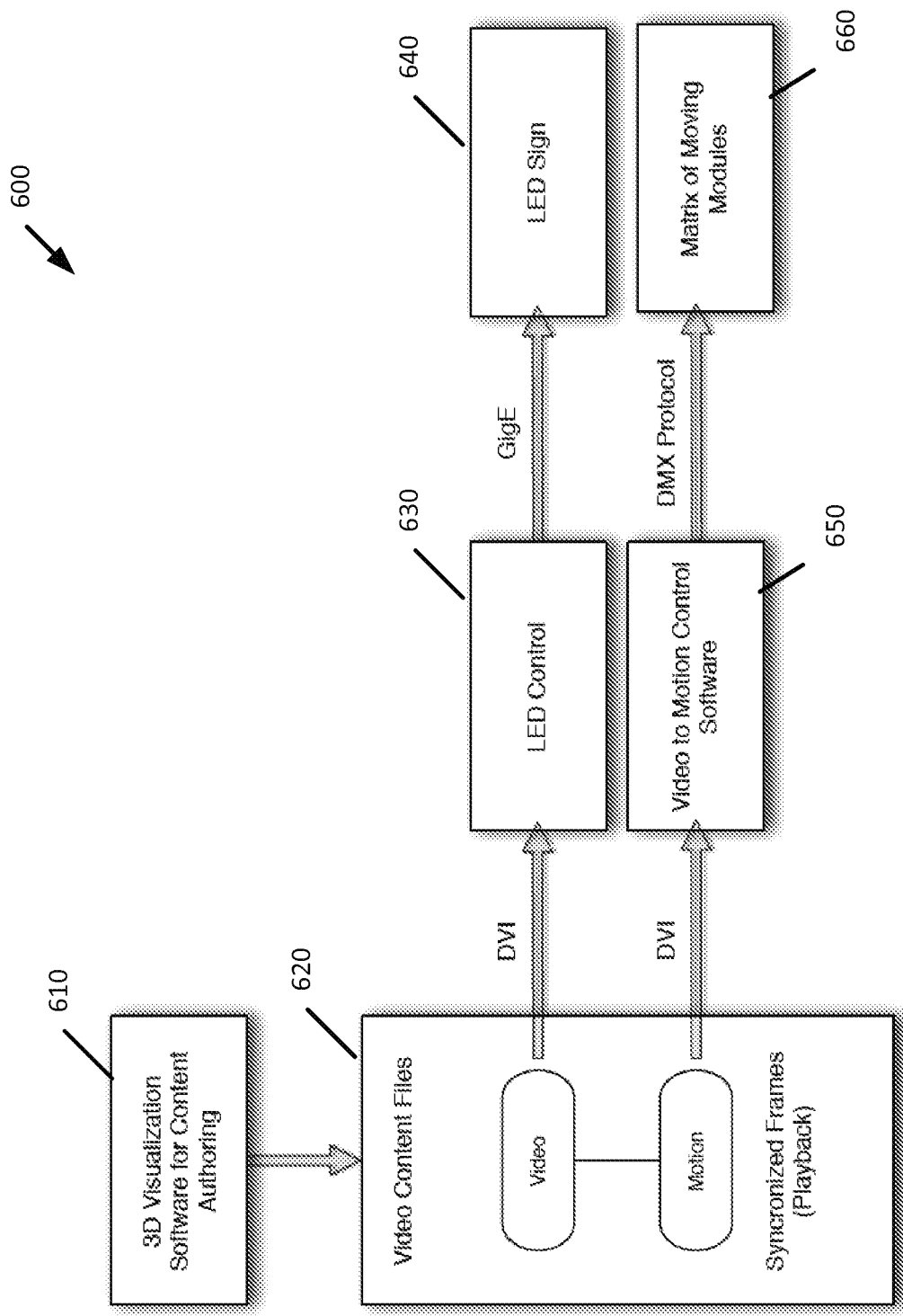
FIG. 14 is a schematic view of an example process for controlling the display device using the system of FIG. 13.
Figure 16:
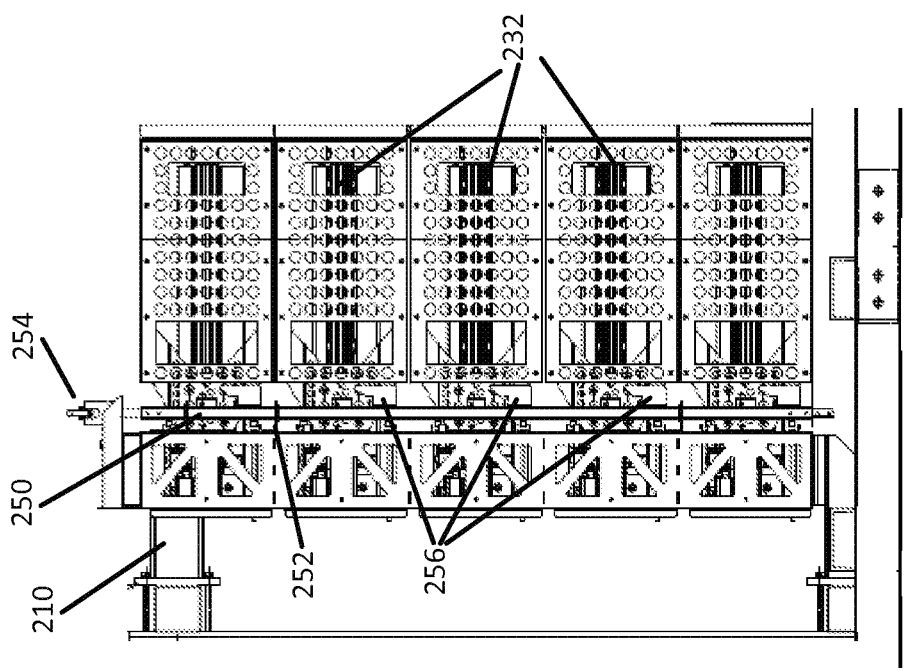
FIG. 16 is a side view of the module of FIG. 15.
Figure 15:
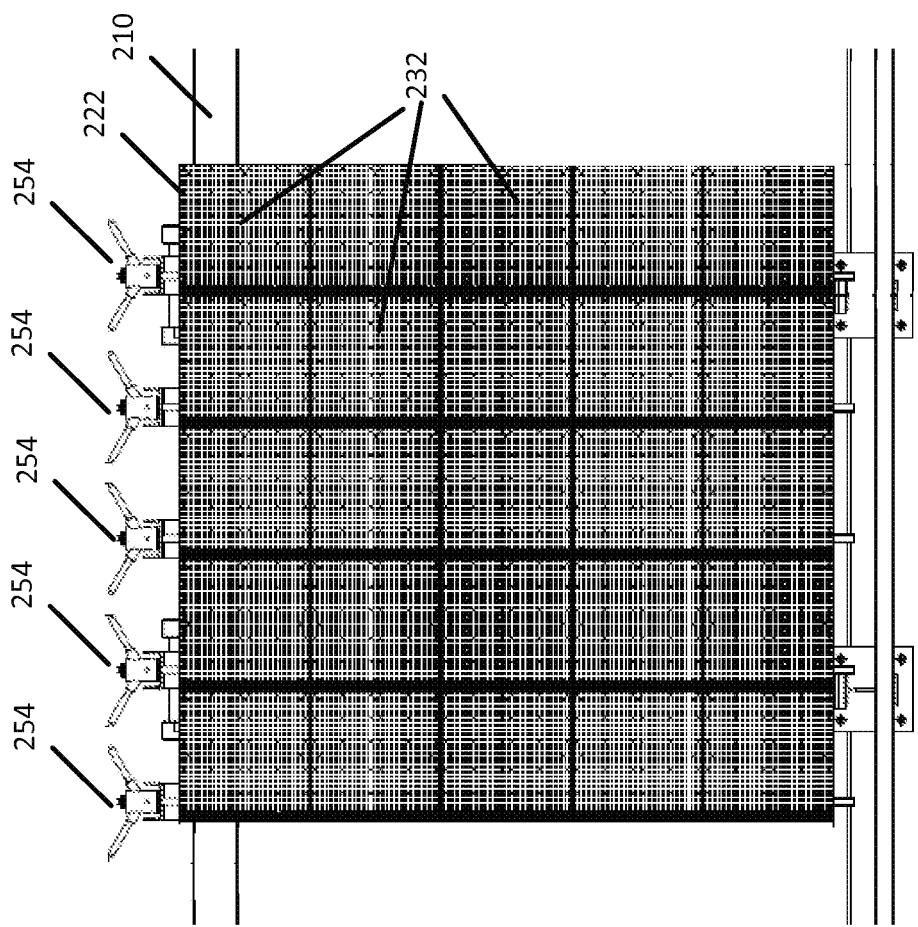
FIG. 15 is a front view of a module of the display device shown in FIG. 2.

Referring now to FIG. 14, an example process 600 for controlling the display device 100 is shown. Some of the operations in this process 600 can be implemented, for example, by the computing device 502.

At operation 610, a video creation software application such as a three-dimensional visualization software is used to author content for the display device 100. The software, which is executed by the computing device 502 (or any other computing device, not necessarily connected to the display device 100), allows for the creation and/or manipulation of video content that will be used to control the display device 100. The software optionally includes an emulator that depicts the display device 100 to allow a user to author different content for the display device. One example of such content is an advertisement featuring a bottle. The advertisement can define the shape, motion, and color of the bottle to be depicted on the display device 100.

Next, at operation 620, the content is edited into video (i.e., color) and motion components. This is accomplished by extracting the video and motion components so that dual synchronized video files are formed. The first video file is for controlling the light display (the LED modules), and the second video file is for controlling the motion (i.e., the moving cubes).

The first video file is transferred to operations 630, 640, whereat the LED modules of the display device 100 are controlled. This includes controlling which of the LED modules are active and any content displayed on the LED modules. In this example, the LED modules are controlled using the GigE protocol.

The second video file is transferred to operation 650, whereat the motion file is interpreted and translated into the DMX protocol. This protocol is, in turn, used at operation 660 to control movement of the moving cubes of the actuator assemblies by the servo motor.

By synchronizing the first and second video files, the visual and motion components of the display device 100 are synchronized to create the desired effects as defined by the author.

In these examples, the computing device 502 includes one or more processing units and computer readable media. Computer readable media includes physical memory such as volatile memory (such as RAM), non-volatile memory (such as ROM, flash memory, etc.) or some combination thereof. Additionally, the computing device can include mass storage (removable and/or non-removable) such as a magnetic or optical disks or tape. An operating system, such as Linux or Windows, and one or more application programs can be stored on the mass storage device. The computing device can include input devices (such as a keyboard and mouse) and output devices (such as a monitor and printer).

The computing device also includes network connections to other devices, computers, networks, servers, etc., such as through the network 504. In example embodiments, the computing device communicates with other components through one or more networks, such as a local area network (LAN), a wide area network (WAN), the Internet, or a combination thereof. Communications can be implemented using wired and/or wireless technologies.

The display device 100 is configured to be resistant to the forces of nature. For example, the display device (including the base structure 210 and the modules 222) is configured to withstand rain and wind as the display device 100 is used outside during the different seasons. As noted herein, in certain weather conditions, certain functions of the display device 100 can be suspended temporarily.

Figure 25:
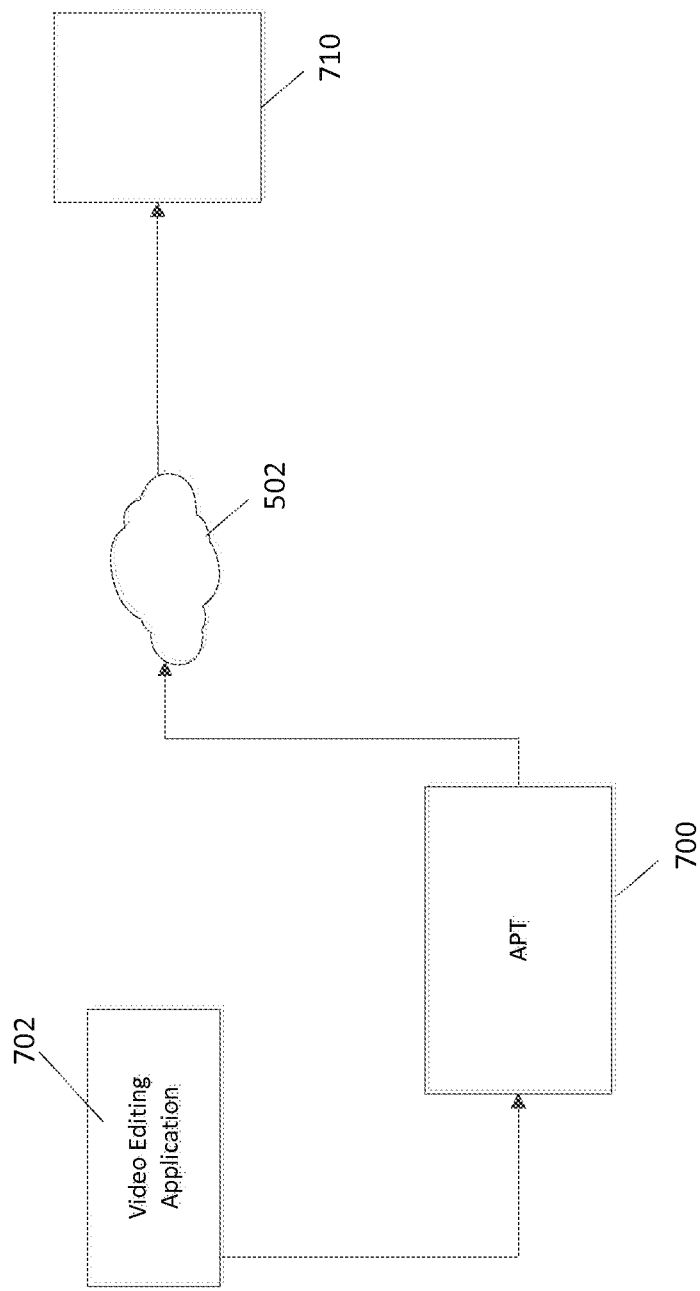
FIG. 25 is a schematic view of aspects of an example Agency Preview Tool.

FIG. 25 illustrates further example aspects of the system 500 and process 600 shown in FIGS. 13 and 14. A preview tool, sometimes referred to herein as the "Agency Preview Tool" (APT), is provided in some disclosed implementations. The APT 700 allows agencies preparing content for the display device 100 to preview content as it will appear on the display device 100. Additionally, embodiments of the APT 700 correctly format video content that is to be exported for display on the device 100 to ensure its compatibility with the various components of the system 500. Among other things, this allows creative preview and experimentation while creating new content, visual verification of correct synchronization between the video content, and the movement content that drives the movement of the actuator assemblies 232. In some examples, the APT 700 further checks to insure technical compliance of the created content with the physical capabilities and limits of the display device 100. For instance, the APT 700 may verify that the content to be displayed does not require the actuator assemblies 232 to move faster than they are capable of moving. Content to be displayed is exported in a format ready for integration, including files with content suitable for display on the display device 100, encoded module movement content, a sign preview, and metadata containing information such as the estimated power consumption of the content, for example.

Embodiments of the APT 700 receive as inputs a display video intended to be shown on the LED modules 316, and a movement video which is an encoded representation of the LED module movement. As shown in FIG. 25, the APT 700 receives the display and movement videos from a video editing application 702. In certain implementations, the movement video is a movie that matches the display video's dimensions but is a black and white or greyscale video. Black represents an actuator assembly 232 that is fully retracted, and white represents an actuator assembly module 232 that is fully extended. The motion control video is discussed further below.

Figure 26:
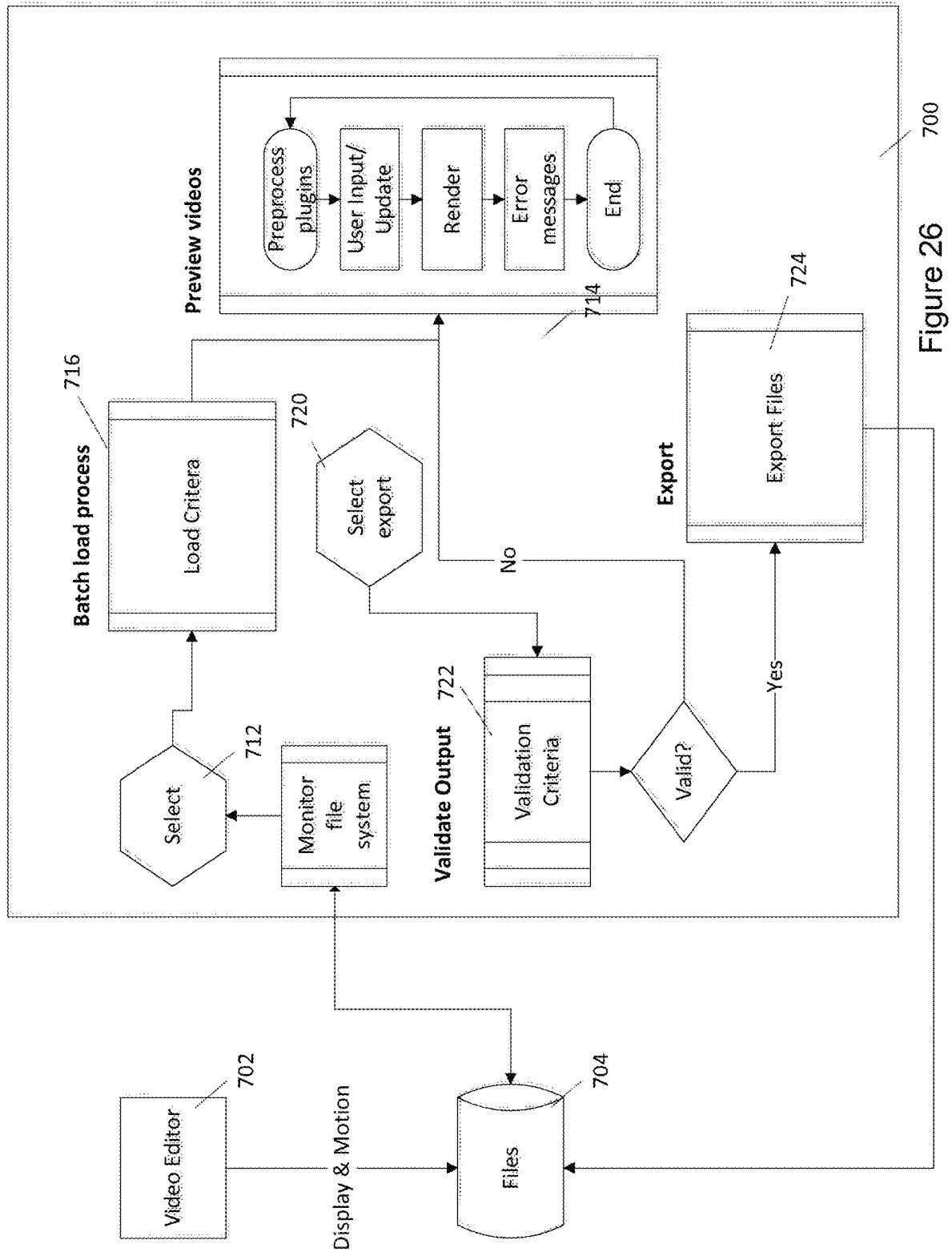
FIG. 26 is a schematic view of further aspects of the Agency Preview Tool of FIG. 25.

FIG. 26 illustrates further aspects of an example APT 700. The content and motion video files are provided from the video editor 702 to a file storage system 704. The user selects the desired video files from the file storage 704, and the selected files 712 are loaded to a preview process 714 via a batch load process 716. Some versions of the APT 700 estimate and/or simulate additional information. In the APT shown in FIG. 26, for example, power consumption by the display device 100 is estimated during the batch load process 716, and the user may be informed if power consumption for the provided display content equals or exceeds a threshold. Additionally, content to be displayed may be analyzed for excessive movement. During preview of the display, the APT may display inline warning/error messages identifying content that contains excessive movement.

Examples of the APT 700 further provide the ability to export the content once the user has completed creating and previewing it. With the system illustrated in FIG. 25, the APT 700 outputs content over a network such as the internet 710 to a device controlling the display 100, such as the computing device 502. Upon selection by the user in process 720, content to be exported is validated in a validation process 722 prior to export. If content to be exported is found invalid (power consumption or actuator movement is outside predetermined thresholds, for example) the user is notified via the preview process 714.

Valid export data 724 include, for example, a file with video correctly formatted for display by the LED controllers 370, and a file with video correctly formatted for interpretation for movement by the actuator assemblies 232.

As noted above, some embodiments of the APT 700 provide the interface for including actuator assembly 232 movement along with the displayed video content. End users may either create movement to go along with their display videos using a video editing application 702 of choice, or they may select default movement files provided within the APT. For example, the APT 700 may include a library of pre-generated movement videos that define predetermined movement patterns available for users of the APT 700.

Embodiments of the APT 700 are configured to verify that the video and motion files are the same length. If the files are not the same length, various solutions may be employed. For example, if the content video is longer than motion video, an error message is presented to the user informing them if they continue the motion content will be looped. If the motion video is longer than the content video, an error message is presented to the user informing them if they continue the motion content will be truncated.

To combine the content and movement video files to simulate the video and motion together, both a content video file and corresponding movement file are loaded to the APT 700 from the editing application 702. For the content video file, the APT 700 checks for the appropriate file type, length, etc. in the validation process 722. Each video frame is read in sequence and converted to an image for manipulation by a three dimensional simulator. As noted above, the disclosed example display device 100 includes a grid having movable LED modules 316. The content video file is thus split into a corresponding grid for display on the individual LED modules 316 of each module 222. The movement file is the same size as the content video file, and is also split into a corresponding grid.

Figure 27A:
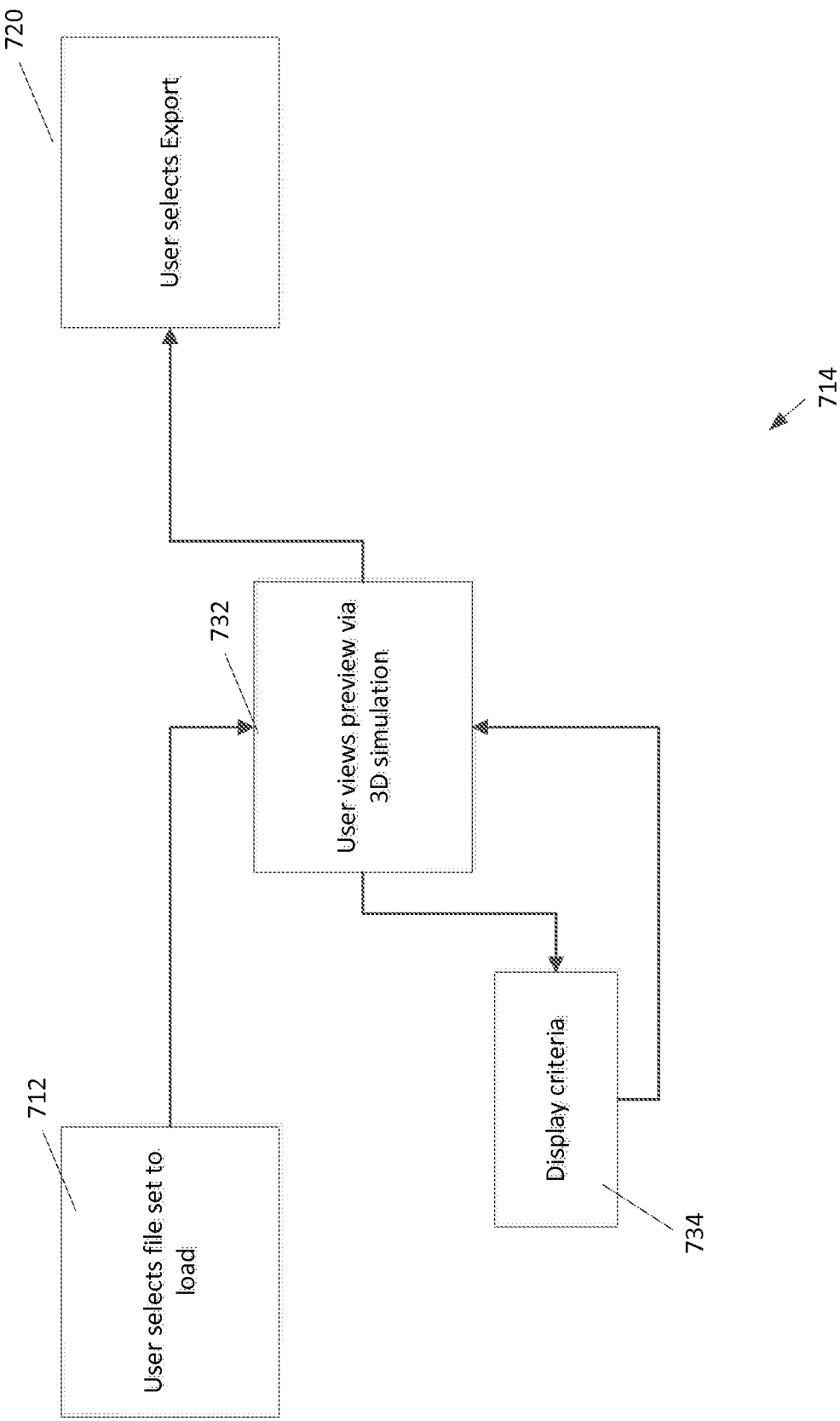
FIG. 27A is a schematic view of a process for exporting content.
Figure 27B:
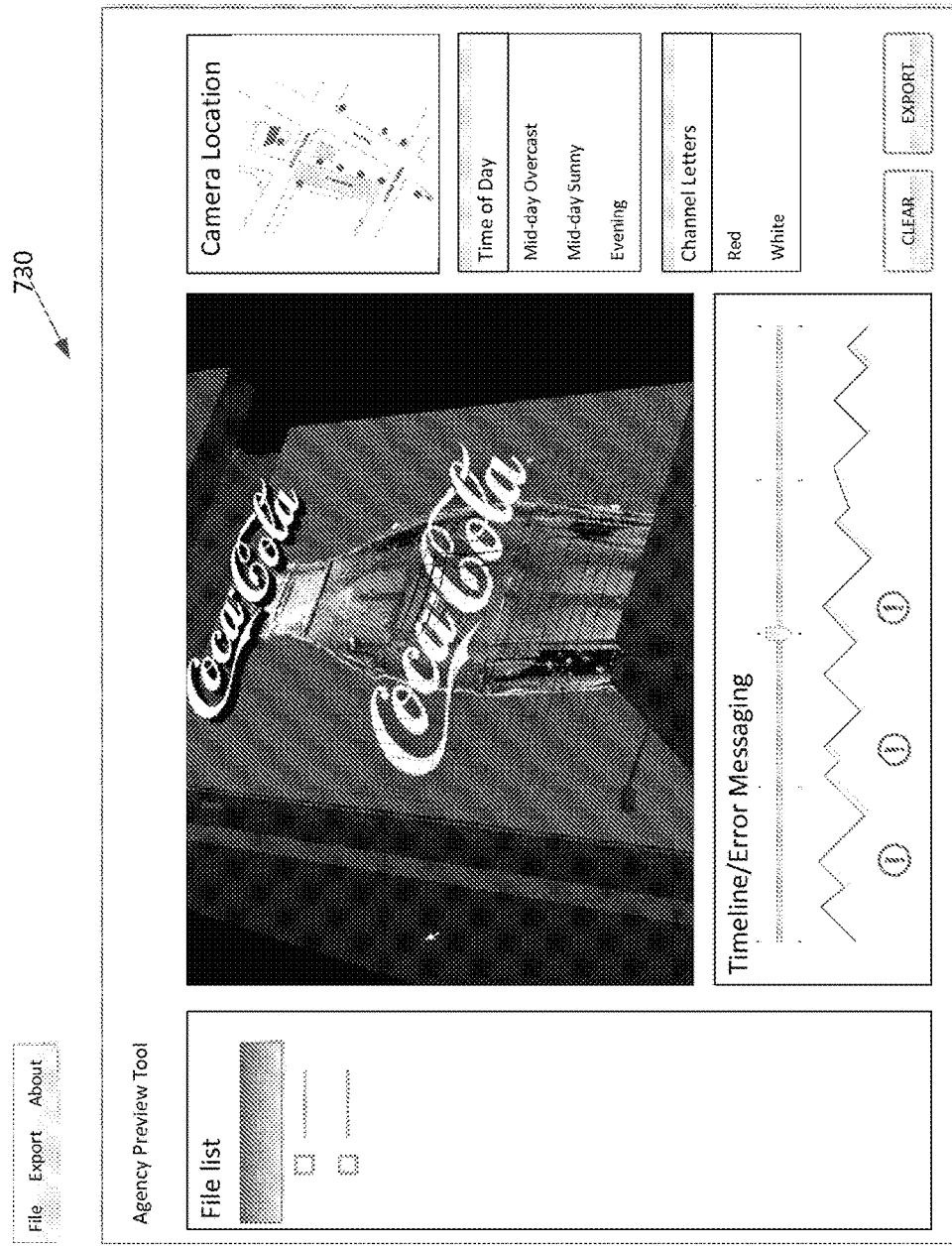
FIG. 27B is an example screen shot from the Agency Preview Tool of FIG. 25.

FIG. 27A illustrates further aspects of the preview process. The user selects files to be loaded from the file storage 704. Embodiments of the APT 700 allow a user to preview content in a three dimensional simulation as it will appear on the display device 100 according to various display conditions such as various distances, angles, and daylight conditions (sunny, overcast, evening, etc.). For example, the APT 700 may be configured to provide previews simulating the display device 100 from distances of 70 feet, 150 feet, and 250 feet. Accordingly, as depicted in FIG. 27, the user selects can selected desired display criteria 734 for the three dimensional simulation 732. FIG. 27B illustrates a screen shoot 730 of an example APT 700, showing examples of such user choices such as the desired time of day, camera position, colors for the stationary 104 display (channel letters), colors for and side panel 180 areas, etc. After previewing, the user may export the files for display 720.

Figure 28:
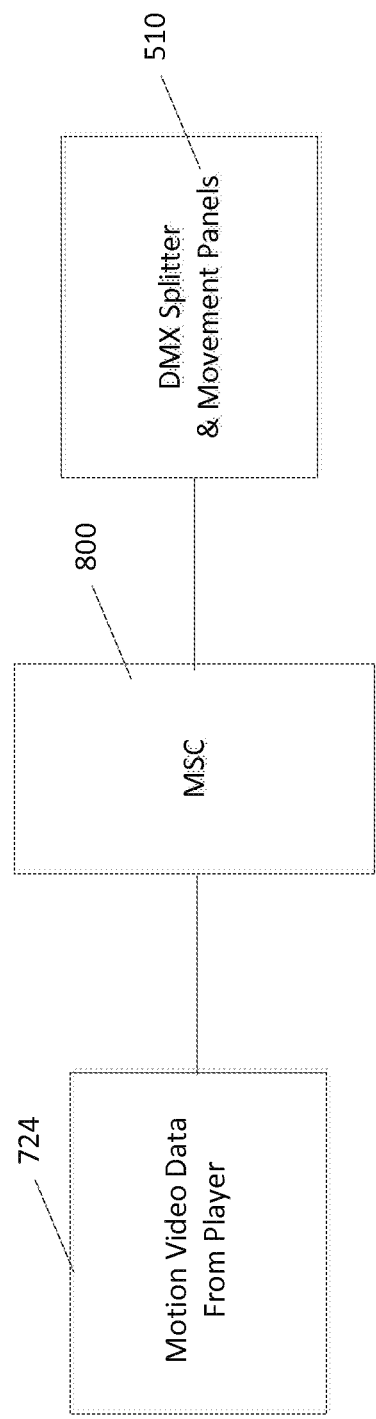
FIG. 28 is a schematic view of aspects of an example Movement Software Controller.

As noted above in conjunction with FIG. 13, motion content is sent to the display device 100 via DMX splitters 510. In some example implementations, the movement software controller (MSC) provides the movement information that is sent to the actuator assemblies 232 via the DMX splitters 510. FIG. 28 illustrates aspects of an example MSC 800, which includes components that manage and communicate with the actuator assemblies 232. As shown in FIG. 28, the MSC 800 receives the exported data (motion video) 724 as verified by the APT 700, and converts the motion video data to a format suitable for controlling the actuator assemblies 232. The movement control data are then sent to the display device via the DMX splitters 510.

In certain implementations, the MSC 800 is installed at the location of the display device 100 and provides operational functionality for the movement of the actuator assemblies 232. In some embodiments, the DMX protocol (DM512) is used for communicating to the actuator assemblies 232. The signals output by the MSC are thus converted to DMX instructions suitable for controlling the actuator assemblies 232. In some embodiments, the LightFactory control system from dreamsolutions of Auckland, New Zealand is used to convert the greyscale video signal data into DMX512 instructions.

Figure 29:
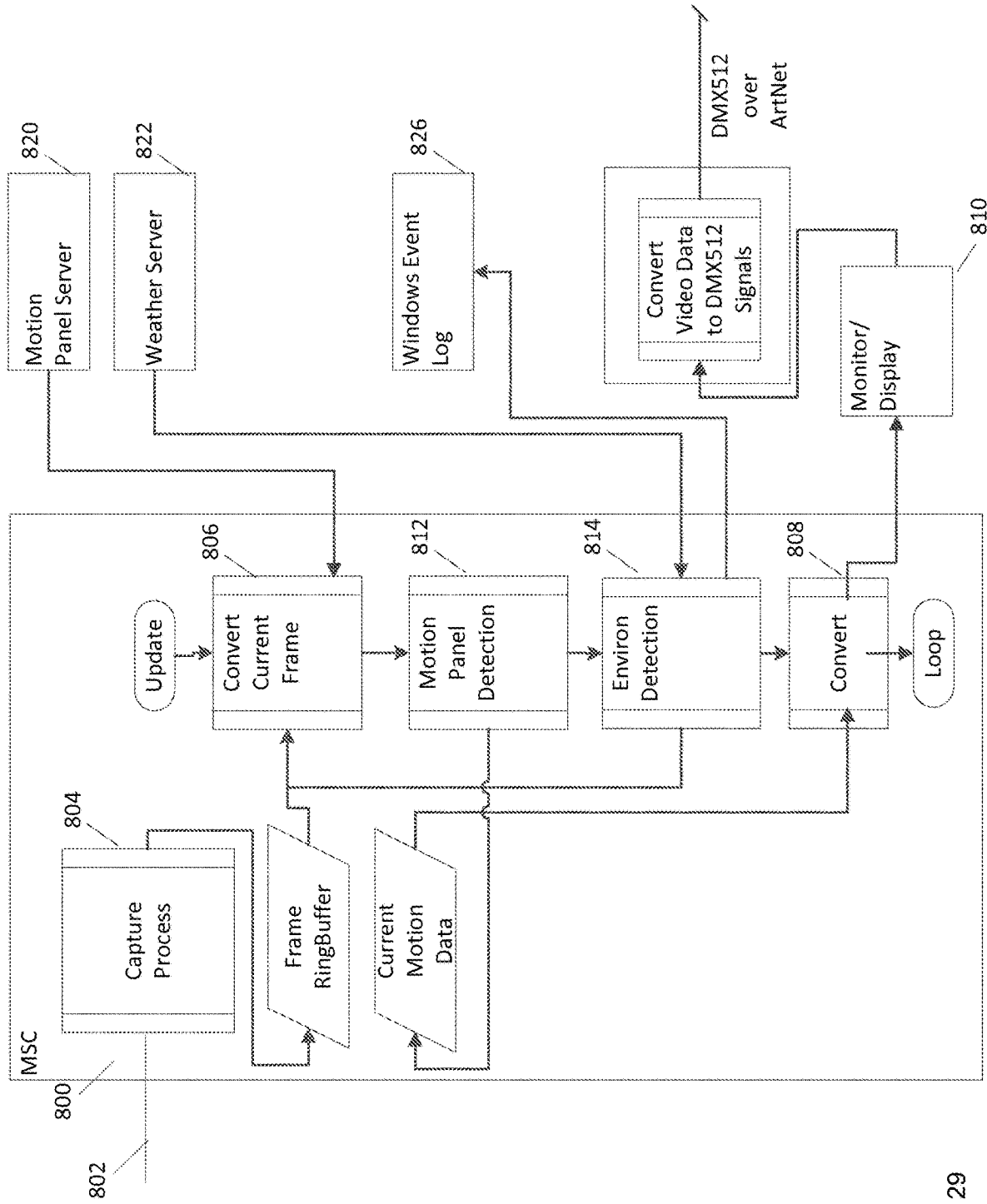
FIG. 29 is a schematic view of further aspects of the Movement Software Controller of FIG. 28.

FIG. 29 illustrates further aspects of an example of the MSC 800. The MSC 800 receives the motion video data that includes the information for controlling movement of the actuator assemblies 232, for example, via a DVI cable 802. In some implementations, the greyscale motion video is a 1200×1600 30 fps video accessed via a capture card 804. The greyscale video data are converted to motion data frame by frame in a conversion process 806. The movement video signal is captured at 30 fps, and each video frame is converted to an image for manipulation by the MSC 800. The video frames will be converted to module data split into a grid to match the grid of the display device 100, with an individual value for each actuator assembly that defines the position of the actuator assembly 232. This is then used as the "movement" values for the corresponding actuator assemblies 232 that move the LED modules 316 in the grid. In one example, the movement values range from 1 (black, actuator assembly 232 fully retracted) to 51,000 (white, actuator assembly 232 fully extended).

A conversion process 808 converts the motion data to visual data, and the MSC 800 displays the motion data as a visual output (the greyscale data is displayed to the MSC monitor 810). Each frame of movement data is converted to a greyscale red, green and blue value. This greyscale value is drawn to the screen 810 as 28 pixel wide by 28 pixel high squares arranged in a grid (exactly like the movement video file exported from the APT 700). The visual motion data is converted to an internal representation of motion. The greyscale value for video for each module is converted into a numeric value between 0 and 255 (0 being completely black and 255 being fully white). The greyscale numeric value is then converted to DMX512 instructions such that the numeric values correspond to the extension of the actuator assemblies 232 as described above.

As illustrated in the example of FIG. 29, the MSC 800 includes a motion panel process 812 that communicates with a motion panel 820 and an environmental process 814 that communicates with additional sensors, such as one or more environmental sensors. The motion panel 820, for example, provides a physical panel for overriding the actuator assembly 232 movement. It includes physical switches that are mapped to the MSC 800 to override the control of the actuator assemblies 232 for maintenance, etc. Some embodiments include a master on/off switch that controls all of the actuator assemblies, a series of grid control switches that controls individual modules 222 for actuator assembly 232 replacement or cleaning. The MSC 800 receives instructions from the panel 820 and modifies the incoming movement video signal to disable or enable the desired actuator assemblies 232. Various mechanical test modes are included to ensure the mechanical functionality of all modules, including, for example, testing movement speed, distance, etc. of the actuator assemblies.

In the some examples, the environmental sensors include a weather server 822 that provides data regarding weather conditions such as wind speed, temperature, humidity, etc. During normal operation, the MSC 800 regularly requests updates (for example, each second) from the motion panel and environmental servers 820,822. In some implementations, each of these services has a separate timeout period (e.g., 60 seconds for the maintenance panel 820, 30 seconds for the weather sensors 822,824). If the service returns a negative status response during the entire timeout period, the MSC 800 will disable movement of the actuator assemblies 232. The MSC 800 will enable movement once the web service has again returned a positive status response for the entire timeout period. Additionally, if the web service is completely unresponsive during this timeout period, the MSC 800 will disable movement. The MSC 800 will enable movement once the web service has again been responsive for the entire timeout period.

In some implementations, the MCS 800 further includes a power usage detection process that monitors power consumption of the display device 100. For example, a power consumption threshold parameter may be determined and used as an input to the MSC 800. Power usage is monitored for module movement, LEDs, and other ancillary components. If power usage exceeds the threshold parameter, a warning or message is sent to an event log 826.

Figure 30:
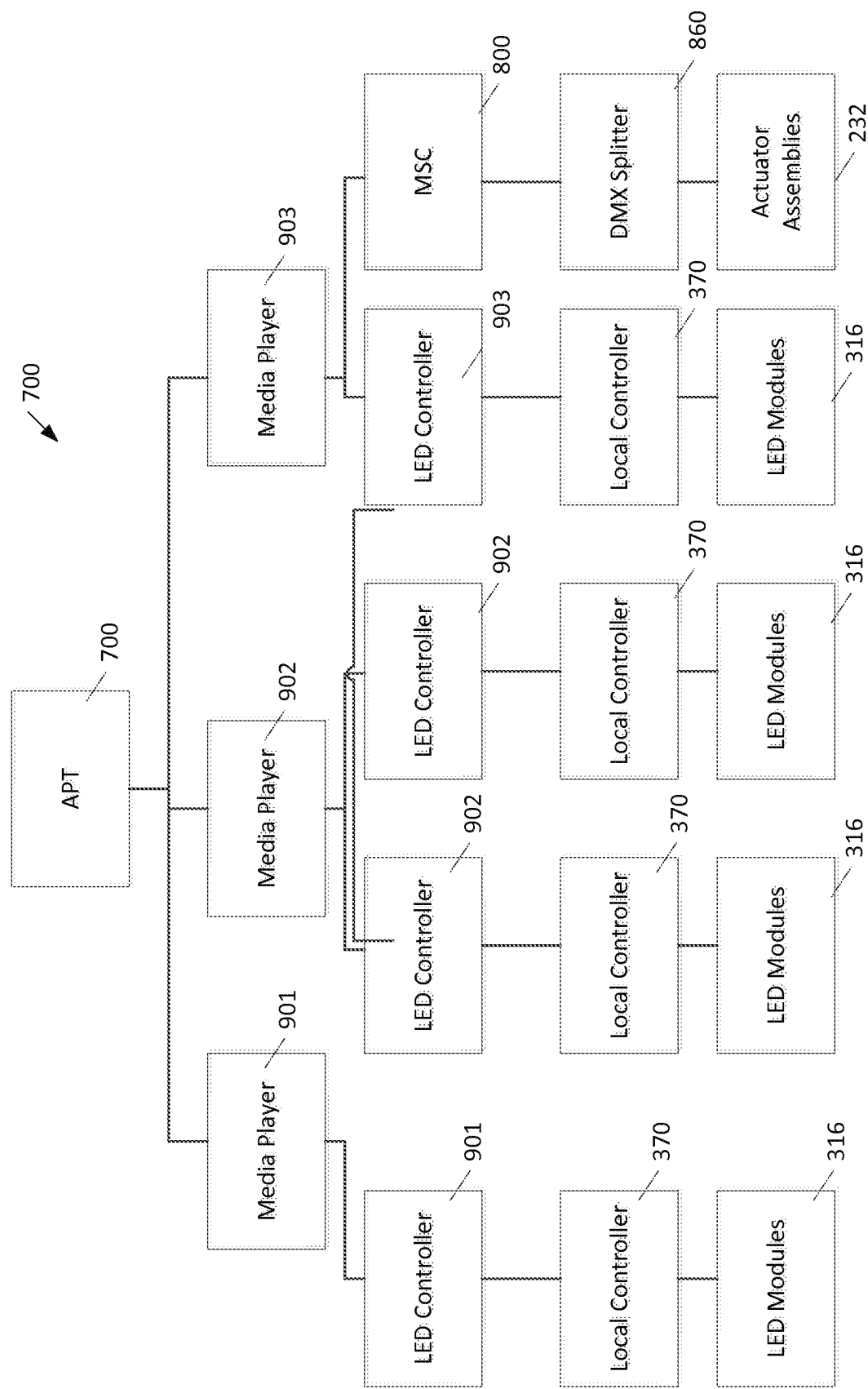
FIG. 30 is a schematic view of further aspects of the example system of FIG. 13.

FIG. 30 illustrates a further example of the system 500. The video content file for controlling the display on the LED modules and the greyscale video providing movement information are sent to media players 901,902,903 corresponding to the stationary display portion 104, side displays 108, and the main, dynamic area 160 of the display device. In some implementations, the side displays 108 do not include the actuator assemblies 232, and instead have static LED panels 316. Thus, the media players 901, 902 for the static portion 104 and the side displays 108 only receive the display video for controlling the output of the LED panels in those portions of the display device 100, while the media player 903 corresponding to the active portion 104 of the display device 100 receives both the content and movement videos. If different content is displayed on the respective side displays 108, respective LED controllers 902 may be provided. The content video is then received by LED controllers 911,912,913, which in turn distribute the content information to the local controllers 370 connected to the individual LED modules 316. The MSC 800 receives the greyscale video from the media player 903 over DVI, and the motion data is converted to DMX motion signals that are sent to a DMX splitter 860 over DMX512 for controlling the individual actuator assemblies 232 for moving the LED modules 316.

The various embodiments described above are provided by way of illustration only and should not be construed to limiting. Those skilled in the art will readily recognize various modifications and changes that may be made to the embodiments described above without departing from the true spirit and scope of the disclosure or the following claims.

What is claimed is:

1. A display device, comprising:
   a plurality of lit elements located in the display device; and
   a plurality of modules, the plurality of modules including both movable modules and non-movable modules;
   wherein the movable modules are adapted to form a dynamic area of the display device; and
   wherein the non-movable modules are adapted to form a stationary area of the display device.

2. The display device of claim 1, wherein the stationary area includes at least one logo graphic.

3. The display device of claim 1, wherein a height of the display device is 19.6 meters and a width of the display device is 12.25 meters.

4. The display device of claim 1, wherein the movable modules each includes at least one actuator assembly positioned therein, with each at least one actuator assembly being individually controllable to move between a retracted state and a plurality of extended states, and a plurality of light modules being coupled to each at least one actuator assembly.

5. The display device of claim 4, wherein the plurality of light modules each includes a plurality of light-emitting diodes, with each of the plurality of light-emitting diodes providing a plurality of colors.

6. The display device of claim 4, further comprising a controller coupled to each one of the movable modules, the controller being programed to control each at least one actuator assembly as each at least one actuator assembly moves between the retracted state and the plurality of extended states.

7. The display device of claim 6, wherein the controller accesses a video file to determine a desired state from among the retracted state and the plurality of extended states for each at least one actuator assembly.

8. The display device of claim 4, wherein each at least one actuator assembly includes:
   a stationary core;
   a holding tube coupled to the stationary core;
   a moving cube movably coupled to the holding tube; and
   an actuator coupled between the holding tube and the moving cube, the actuator being programmed to move the moving cube between the retracted state and the plurality of extended states.

9. The display device of claim 8, wherein the moving cube includes a plurality of panels removably coupled to one another and sized to be positioned about the holding tube.

10. The display device of claim 8, wherein the actuator is a linear actuator, and wherein the linear actuator includes a servo motor positioned to slide the moving cube along the holding tube between the retracted state and the plurality of extended states.

11. The display device of claim 4, further comprising a mechanical locking arrangement for securely locking each at least one actuator assembly in the retracted state.

12. A system for displaying content, the system comprising:
   a display device including:
      a plurality of lit elements located in the display device;
      a plurality of modules, the plurality of modules including both movable modules and non-movable modules;
      wherein the movable modules are adapted to form a dynamic area of the display device; and
      wherein the non-movable modules are adapted to form a stationary area of the display device;
   a computing device configured to generate content for the display device, the computing device including:
      memory; and
      a processor to execute instructions stored in the memory to control the plurality of movable modules.

13. The system of claim 12, wherein the stationary area includes at least one logo graphic.

14. The system of claim 12, wherein each one of the movable modules includes at least one actuator assembly positioned therein, with each at least one actuator assembly being individually controllable to move between a retracted state and a plurality of extended states, and a plurality of light modules being coupled to each at least one actuator assembly.

15. The system of claim 14, wherein the plurality of light modules each includes a plurality of light-emitting diodes, with each of the plurality of light-emitting diodes providing a plurality of colors.

16. The system of claim 14, wherein each at least one actuator assembly includes:
a stationary core;
a holding tube coupled to the stationary core;
a moving cube movably coupled to the holding tube; and
an actuator coupled between the holding tube and the moving cube, the actuator being programmed to move the moving cube between the retracted state and the plurality of extended states.

17. The system of claim 16, wherein the moving cube includes a plurality of panels removably coupled to one another and sized to be positioned about the holding tube.

18. The system of claim 16, wherein the actuator is a linear actuator, and wherein the linear actuator includes a servo motor positioned to slide the moving cube along the holding tube between the retracted state and the plurality of extended states.

19. The system of claim 14, wherein the computing device is programmed to generate content for controlling the display device, the content including first content configured to control motion of each at least one actuator assembly and second content configured to control content displayed by the plurality of light modules, wherein the first content is a first video file that controls the motion of each at least one actuator assembly and the second content is a second video file that controls the content displayed by the plurality of light modules, with the first and second contents being synchronized so that the motion matches the content.

20. The system of claim 14, further comprising a mechanical locking arrangement for securely locking each at least one actuator assembly in the retracted state.

* * * * *

UNITED STATES PATENT AND TRADEMARK OFFICE
CERTIFICATE OF CORRECTION

PATENT NO. : 10,598,357 B2
APPLICATION NO. : 16/271395
DATED : March 24, 2020
INVENTOR(S) : Jurewicz et al.

Page 1 of 1

It is certified that error appears in the above-identified patent and that said Letters Patent is hereby corrected as shown below:

In the Drawings

Sheet 14, Fig. 14, Line 4, Reference numeral 620: delete "Syncronized" and insert --Synchronized--

In the Specification

Column 7, Line 17: delete "in on" and insert --on--

Column 12, Line 62: delete "In the" and insert --In--

In the Claims

Column 14, Line 15, Claim 6: delete "programed" and insert --programmed--

Signed and Sealed this
Fifteenth Day of December, 2020

Andrei Iancu
*Director of the United States Patent and Trademark Office*